(12) United States Patent
Hwang et al.

(10) Patent No.: US 11,461,051 B2
(45) Date of Patent: Oct. 4, 2022

(54) STORAGE DEVICE AND METHOD OF OPERATING THE SAME

(71) Applicant: SK hynix Inc., Icheon-si (KR)

(72) Inventors: Jun Sun Hwang, Icheon-si (KR); Jung Hwan Lee, Icheon-si (KR); Kwan Su Shon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/183,003

(22) Filed: Feb. 23, 2021

(65) Prior Publication Data
US 2022/0057965 A1 Feb. 24, 2022

(30) Foreign Application Priority Data
Aug. 18, 2020 (KR) .................. 10-2020-0103550

(51) Int. Cl.
G06F 3/00 (2006.01)
G06F 3/06 (2006.01)
G11C 16/04 (2006.01)
G11C 16/10 (2006.01)
G06F 13/40 (2006.01)
G11C 16/26 (2006.01)

(52) U.S. Cl.
CPC .......... *G06F 3/0659* (2013.01); *G06F 3/0604* (2013.01); *G06F 3/0673* (2013.01); *G06F 13/4086* (2013.01); *G11C 16/0483* (2013.01); *G11C 16/10* (2013.01); *G11C 16/26* (2013.01)

(58) Field of Classification Search
CPC ... G11C 7/1048; G11C 7/1057; G11C 7/1084; G11C 16/0483; G11C 16/10; G11C 16/26; G11C 7/1045; G11C 7/222; G11C 5/04; G11C 5/063; G11C 11/4093; G11C 7/1066; G11C 7/1072; G11C 7/1078; G11C 7/1093; G11C 8/12; G11C 7/1006; G11C 7/109; G11C 8/10; G06F 12/00; G06F 13/368; G06F 13/4086; G06F 3/0604; G06F 3/0659; G06F 3/0673; H04L 25/0298
USPC ......................................................... 711/154
See application file for complete search history.

(56) References Cited

U.S. PATENT DOCUMENTS

2020/0219546 A1* 7/2020 Lee ...................... G11C 7/1057

FOREIGN PATENT DOCUMENTS

KR 101904313 B1 10/2018
KR 1020190050609 A 5/2019

\* cited by examiner

*Primary Examiner* — Thong Q Le
(74) *Attorney, Agent, or Firm* — William Park & Associates Ltd.

(57) ABSTRACT

The present technology relates to an electronic device. A storage device in which a memory device controls an ODT operation to improve operation performance of the memory device with a small number of pins includes a plurality of memory devices comprising a target memory device in which an operation is performed and non-target memory devices, and a memory controller configured to control the plurality of memory devices. Each of the plurality of memory devices includes an on die termination (ODT) flag generator configured to generate a flag that indicates that an ODT operation is possible for the non-target memory devices, and an ODT performer configured to determine whether the ODT operation is an ODT read operation for a read operation or an ODT write operation for a write operation based on the flag and configured to generate an enable signal that enables the ODT read operation or the ODT write operation.

20 Claims, 23 Drawing Sheets

FIG. 6B

|  | RB | READY/BUSY |
|---|---|---|
| MD1 | 0 (LOW) | BUSY |
| MD2 | 1 (HIGH) | READY |
| MD3 | 1 (HIGH) | READY |
| MD4 | 1 (HIGH) | READY |

STORAGE DEVICE AND METHOD OF OPERATING THE SAME

CROSS-REFERENCE TO RELATED APPLICATION

The present application claims priority under 35 U.S.C. § 119(a) to Korean patent application number 10-2020-0103550 filed on Aug. 18, 2020, in the Korean Intellectual Property Office, the entire disclosure of which is incorporated by reference herein.

BACKGROUND

1. Technical Field

The present disclosure relates to an electronic device, and more particularly, to a storage device and a method of operating the same.

2. Related Art

A storage device is a device that stores data based on a host device such as a computer, a smart phone, or a smart pad. The storage device includes a device that stores data in a magnetic disk such as a hard disk drive (HDD), a device that stores data in a semiconductor memory such as a solid state drive (SSD), or a memory card, in particular, a non-volatile memory.

The storage device may include a memory device in which data is stored and a memory controller that stores data in the memory device. The memory device may be classified into a volatile memory and a non-volatile memory. Here, the non-volatile memory includes a read only memory (ROM), a programmable ROM (PROM), an electrically programmable ROM (EPROM), an electrically erasable and programmable ROM (EPM), a flash memory, a phase-change RAM (PRAM), a magnetic RAM (MRAM), a resistive RAM (RRAM), a ferroelectric RAM (FRAM) and the like.

SUMMARY

A storage device according to an embodiment of the present disclosure includes a plurality of memory devices comprising a target memory device in which an operation is performed and non-target memory devices, and a memory controller configured to control the plurality of memory devices. Each of the plurality of memory devices includes an on die termination (ODT) flag generator configured to generate a flag that indicates that an ODT operation is possible for the non-target memory devices, and an ODT performer configured to determine whether the ODT operation is an ODT read operation for a read operation or an ODT write operation for a write operation based on the flag and configured to generate an enable signal that enables the ODT read operation or the ODT write operation.

A method of operating a storage device with a plurality of memory devices and a memory controller that controls the plurality of memory devices according to an embodiment of the present disclosure includes performing an operation, by a target memory device, among the plurality of memory devices, generating a flag indicating that an on die termination (ODT) operation is possible for non-target memory devices, determining whether the ODT operation is an ODT read operation for a read operation or an ODT write operation for a write operation based on the flag, and generating, by the non-target memory devices, an enable signal that enables the ODT read operation or the ODT write operation.

BRIEF DESCRIPTION OF THE DRAWINGS

FIGS. 6A and 6B are diagrams, illustrating a target memory device and a non-target memory device when the number of memory devices of FIG. 1 is plural.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Hereinafter, embodiments of the present disclosure will be described in detail with reference to the accompanying drawings, so that those skilled in the art to which the present disclosure pertains may easily carry out the technical spirit of the present disclosure.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

An embodiment of the present disclosure provides a storage device that controls an on die termination (ODT) operation without controlling an ODT pin of a memory controller, and a method of operating the same.

According to the present technology, the memory device controls the on die termination (ODT) operation by using a ready-busy (RB) pin of the memory device without using an ODT pin of the memory controller, and thus the memory device may improve operation performance of the memory device with the small number of pins.

Figure 1:
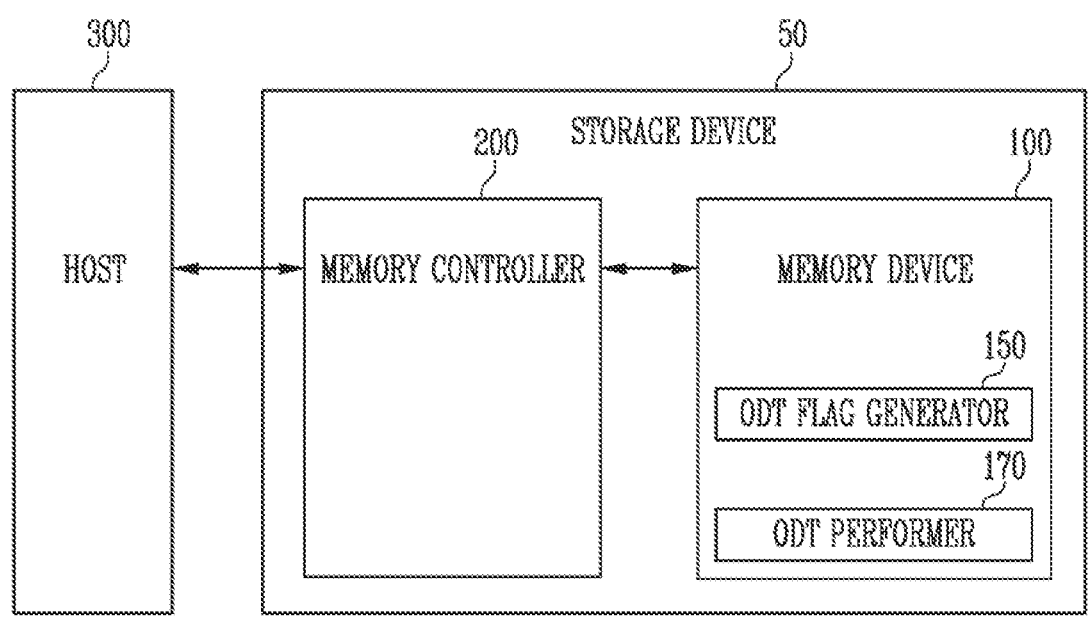
FIG. 1 is a block diagram, illustrating a storage device.

FIG. 1 is a block diagram, illustrating a storage device.

Referring to FIG. 1, the storage device 50 may include a memory device 100 and a memory controller 200.

The storage device 50 may be a device that stores data based on a host 300, such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface, which is a means to communicate with the host 300. For example, the storage device 50 may be configured as any one of various types of storage devices, such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 may operate based on the memory controller 200. The memory device 100 may include a memory cell array with a plurality of memory cells storing the data. The memory cell array may include a plurality of memory blocks. Each of the memory blocks may include a plurality of memory cells, and the plurality of memory cells may configure a plurality of pages. In an embodiment, a page may be a unit of measurement for storing data in the memory device 100 or for reading data that is stored in the memory device 100. The memory block may be a unit of measurement for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 may be implemented as a two-dimensional array structure or a three-dimensional array structure. Hereinafter, the three-dimensional array structure will be described as an embodiment, but the present disclosure is not limited to the three-dimensional array structure. The present disclosure may be applied not only to a flash memory device in which a charge storage layer is configured of a conductive floating gate (FG), but also to a charge trap flash (CTF) in which the charge storage layer is configured of an insulating film.

In an embodiment, the memory device 100 may operate in a single level cell (SLC) method in which one data bit is stored in one memory cell. Alternatively, the memory device 100 may operate in a method that stores at least two data bits in one memory cell. For example, the memory device 100 may operate in a multi-level cell (MLC) method that stores two data bits in one memory cell, a triple level cell (TLC) method that stores three data bits in one memory cell, or a quadruple level cell (QLC) method that stores four data bits in one memory cell.

The memory device 100 is configured to receive a command and an address from the memory controller 200 and configured to access a region that is selected by the address in the memory cell array. That is, the memory device 100 may perform an operation, corresponding to the command, on the region that is selected by the address. For example, the memory device 100 may perform a write operation (program operation), a read operation, or an erase operation based on the received command. For example, when a program command is received, the memory device 100 may program data to the region that is selected by the address. When a read command is received, the memory device 100 may read data from the region that is selected by the address. When an erase command is received, the memory device 100 may erase data that is stored in the region that is selected by the address.

In an embodiment, the memory device 100 may include an ODT flag generator 150. The ODT flag generator 150 may generate a flag FLAG that provides instructions to perform an on die termination (ODT) operation on a non-target memory device or a non-target die. The ODT operation may be an operation that improves signal integrity (SI) by minimizing signal reflection or the like at an interface between the memory controller 200 and the memory device 100. That is, the ODT operation may be an operation that sets the size of terminating resistance (RTT) of input/output terminals of the memory controller 200 or the memory device 100, and the ODT operation may be an operation for impedance matching of a data transmission line.

Furthermore, the target memory device may be a memory device in a busy state in which an operation is performed among a plurality of memory devices that are connected to the memory controller 200, and the target die may be a die in a busy state in which an operation is performed among a plurality of dies that are included in one memory device 100. Conversely, the non-target memory device may be a memory device in a ready state in which an operation is not performed among the plurality of memory devices that are connected to the memory controller 200, and the non-target die may be a die in a ready state in which an operation is not performed among a plurality of dies that are included in one memory device 100.

In an embodiment, the ODT flag generator 150 may generate a flag based on an input/output strobe signal and a read enable signal for the target memory device or the target die. Here, the input/output strobe signal may be a signal that indicates that an input/output signal that is received from the memory controller is valid, and the read enable signal may be a signal that enables an output of data.

In another embodiment, the flag may be generated based on the input/output strobe signal and a write enable signal for the target memory device or the target die. Here, the write enable signal may be a signal that enables an input of data.

In an embodiment, the memory device 100 may include an ODT performer 170. The ODT performer 170 may perform the ODT operation on the non-target memory device or the non-target die based on the flag FLAG that is received from the memory controller 200. The flag FLAG may indicate that the ODT operation on the non-target memory device or the non-target die may be performed. Furthermore, the target memory device and the non-target memory device may be distinguished based on the flag FLAG.

In an embodiment, before the ODT operation is performed, the memory device 100 may perform a preparation operation for performing the ODT operation based on a parameter setting command that is received from the memory controller 200. The preparation operation may include an operation that outputs a strobe signal, indicating that the ODT operation is performed on the non-target memory device or the non-target die, and a signal, indicating that other operations other than the ODT operation might not be performed, to the memory controller 200.

Thereafter, when the ODT performer 170 receives the flag FLAG from the memory controller 200, the ODT performer 170 may generate a signal that provides instructions to perform an ODT write or ODT read operation through a ready/busy signal that is generated based on the flag FLAG and may output the signal to the memory controller 200. Here, the ODT performer 170 may output a signal that turns on a buffer in which data is temporarily stored before performing the ODT write or ODT read operation.

In the conventional art, for performing an ODT operation, the memory controller 200 generates a control signal on its own based on a signal that is output from the memory device 100 and inputs the control signal through an ODT pin in the memory controller 200. Therefore, a terminating resistance (RTT) of the memory controller 200 may be set.

However, in the present disclosure, the ODT operation may be performed based on a signal that is output from the memory device 100 instead of the ODT control signal of the memory controller 200, thereby reducing the burden on the memory controller 200. Furthermore, since the ODT operation may be performed by using the ready/busy pin of the memory device 100 instead of using the ODT pin of the memory controller 200, the burden on the hardware may be minimized.

The memory controller 200 may control the overall operation of the storage device 50.

When a power voltage is applied to the storage device 50, the memory controller 200 may execute the firmware. When the memory device 100 is a flash memory device 100, the memory controller 200 may operate the firmware, such as a flash translation layer (FTL), to control the communication between the host 300 and the memory device 100.

In an embodiment, the memory controller 200 may include the firmware (not shown) that receives data and a logical block address (LBA) from the host 300 and translates the LBA into a physical block address (PBA), indicating an address of the memory cells in which data that is included in the memory device 100 is to be stored. In addition, the memory controller 200 may store a logical-physical address mapping table, configuring a mapping relationship between the LBA and the PBA, in a buffer memory.

The memory controller 200 may control the memory device 100 to perform the program operation, the read operation, the erase operation, or the like based on the request of the host 300. For example, when a program request is received from the host 300, the memory controller 200 may convert the program request into a program command and may provide the program command, the PBA, and data to the memory device 100. When a read request is received from the host 300, together with the LBA, the memory controller 200 may change the read request into a read command, select a PBA that corresponds to the LBA, and then provide the read command and the PBA to the memory device 100. When an erase request is received from the host 300, together with the LBA, the memory controller 200 may change the erase request into an erase command, select a PBA that corresponds to the LBA, and then provide the erase command and the PBA to the memory device 100.

In an embodiment, the memory controller 200 may generate and transmit the program command, the address, and the data to the memory device 100 without the request from the host 300. For example, the memory controller 200 may provide the command, the address, and the data to the memory device 100 to perform background operations, such as a program operation for wear leveling and a program operation for garbage collection.

In an embodiment, the storage device 50 may further include a buffer memory (not shown). The memory controller 200 may control data exchange between the host 300 and the buffer memory (not shown). Alternatively, the memory controller 200 may temporarily store system data to control the memory device 100 in the buffer memory. For example, the memory controller 200 may temporarily store data that is input from the host 300 in the buffer memory and then may transmit data that is temporarily stored in the buffer memory to the memory device 100.

In various embodiments, the buffer memory may be used as an operation memory and a cache memory of the memory controller 200. The buffer memory may store codes or commands that are executed by the memory controller 200. Alternatively, the buffer memory may store data that is processed by the memory controller 200.

In an embodiment, the buffer memory may be implemented as a dynamic random access memory (DRAM), such as a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR), or Rambus dynamic random access memory (DRAM), or a static random access memory (SRAM).

In various embodiments, the buffer memory may be connected through an external device that is outside of the storage device 50. In this case, the volatile memory devices that are externally connected to the storage device 50 may serve as the buffer memory.

In an embodiment, the memory controller 200 may control at least two or more memory devices. In this case, the memory controller 200 may control the memory devices based on an interleaving method in order to improve operation performance.

The host 300 may communicate with the storage device 50 by using at least one of various communication methods, such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
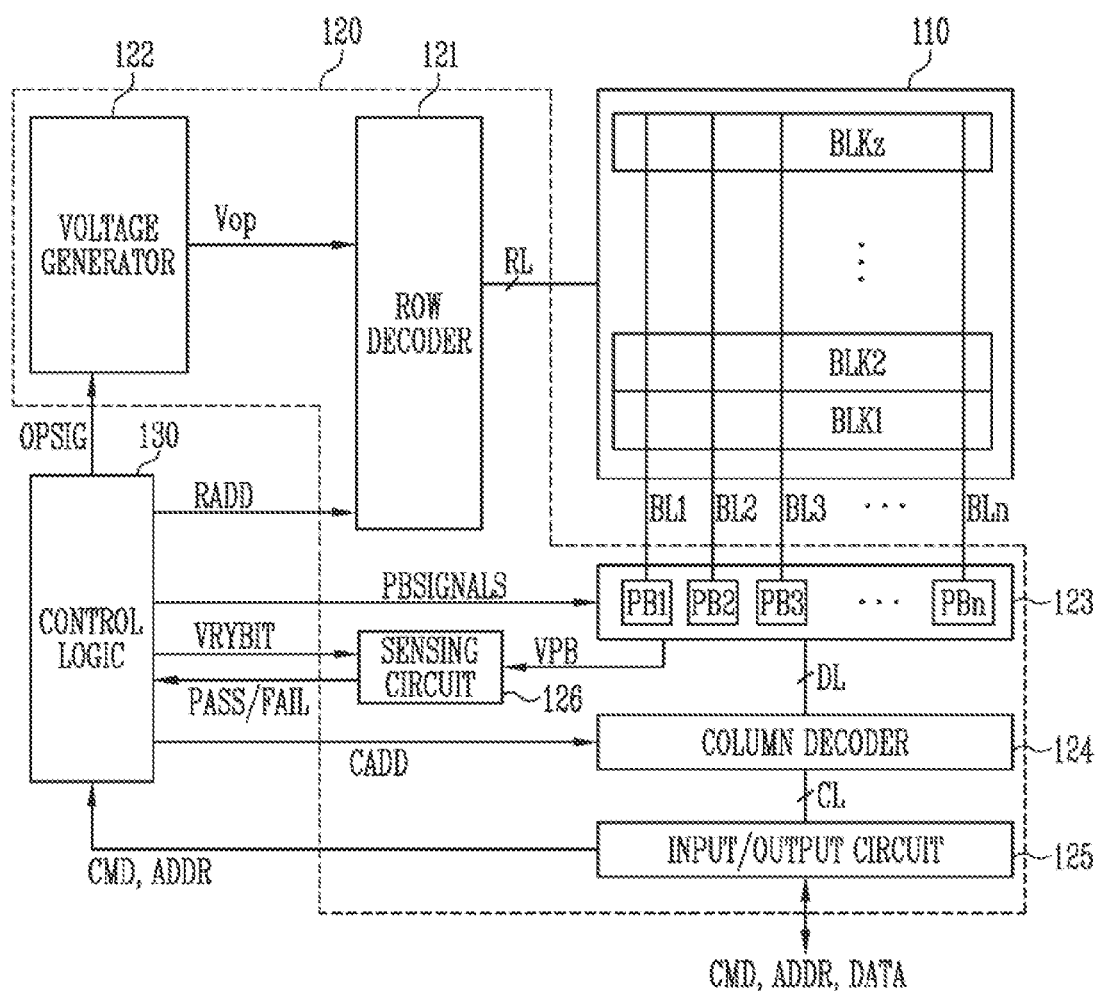
FIG. 2 is diagram, illustrating a structure of a memory device of FIG. 1.

FIG. 2 is diagram, illustrating a structure of the memory device of FIG. 1.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be connected to a row decoder 121 through row lines RL. The plurality of memory blocks BLK1 to BLKz may be connected to the page buffer group 123 through bit lines BL1 to BLn. Each of the plurality of memory blocks BLK1 to BLKz includes a plurality of memory cells. As an embodiment, the plurality of memory cells are non-volatile memory cells. Memory cells that are connected to the same word line may be defined as one page. Therefore, one memory block may include a plurality of pages.

The row lines RL may include at least one source select line, a plurality of word lines, and at least one drain select line.

Each of the memory cells, included in the memory cell array 110, may be configured as a single level cell (SLC) that stores one data bit, a multi-level cell (MLC) that stores two data bits, a triple level cell (TLC) that stores three data bits, or a quadruple level cell (QLC) that stores four data bits.

The peripheral circuit 120 may be configured to perform the program operation, the read operation, or the erase operation on a selected region of the memory cell array 110 based on the control logic 130. The peripheral circuit 120 may drive the memory cell array 110. For example, the peripheral circuit 120 may apply various operation voltages to the row lines RL and the bit lines BL1 to BLn or discharge the applied voltages based on control of the control logic 130.

The peripheral circuit 120 may include a row decoder 121, a voltage generator 122, the page buffer group 123, a column decoder 124, an input/output circuit 125, and a sensing circuit 126.

The row decoder 121 may be connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 may be configured to decode a row address RADD that is received from the control logic 130. The row decoder 121 may select at least one memory block among the memory blocks BLK1 to BLKz based on a decoded address. In addition, the row decoder 121 may select at least one word line of the memory block, selected to apply the voltages that are generated by the voltage generator 122, to at least one word line WL based on the decoded address.

For example, during the program operation, the row decoder 121 may apply a program voltage to a selected word line and apply a program pass voltage of a level that is lower than the program voltage to an unselected word line. During a program verify operation, the row decoder 121 may apply a verify voltage to the selected word line and a verify pass voltage that is higher than the verify voltage to the unselected word line. During the read operation, the row decoder 121 may apply a read voltage to the selected word line and apply a read pass voltage that is higher than the read voltage to the unselected word line.

In an embodiment, the erase operation of the memory device 100 may be performed in a memory block unit. During the erase operation, the row decoder 121 may select one memory block based on the decoded address. During the erase operation, the row decoder 121 may apply a ground voltage to the word lines that are connected to the selected memory block.

The voltage generator 122 may operate based on the control logic 130. The voltage generator 122 may be configured to generate a plurality of voltages by using an external power voltage that is supplied to the memory device 100. Specifically, the voltage generator 122 may generate various operation voltages Vop that are used for the program, read, and erase operations, based on the operation signal OPSIG. For example, the voltage generator 122 may generate the program voltage, the verify voltage, the pass voltage, the read voltage, the erase voltage, and the like based on control of the control logic 130.

As an embodiment, the voltage generator 122 may generate an internal power voltage by regulating the external power voltage. The internal power voltage that is generated by the voltage generator 122 is used as an operation voltage of the memory device 100.

As an embodiment, the voltage generator 122 may generate a plurality of voltages by using the external power voltage or the internal power voltage.

For example, the voltage generator 122 may include a plurality of pumping capacitors that receive the internal power voltage, and may selectively activate the plurality of pumping capacitors to generate the plurality of voltages, based on the control logic 130.

The generated plurality of voltages may be supplied to the memory cell array 110 by the row decoder 121.

The page buffer group 123 may include first to n-th page buffers PB1 to PBn. The first to n-th page buffers PB1 to PBn may be connected to the memory cell array 110 through the first to n-th bit lines BL1 to BLn, respectively. The first to n-th page buffers PB1 to PBn may operate based on the control logic 130. Specifically, the first to n-th page buffers PB1 to PBn may operate based on the page buffer control signals PBSIGNALS. For example, the first to n-th page buffers PB1 to PBn may temporarily store data that is received through the first to n-th bit lines BL1 to BLn or may sense a voltage or a current of the bit lines BL1 to BLn during the read or verify operation.

Specifically, during the program operation, when the program voltage is applied to the selected word line, the first to n-th page buffers PB1 to PBn may transfer data DATA that is received through the input/output circuit 125 to the selected memory cell through the first to n-th bit lines BL1 to BLn. The memory cells of the selected page may be programmed based on the transferred data DATA. During the program verify operation, the first to n-th page buffers PB1 to PBn may read page data by sensing the voltage or the current that is received from the selected memory cells through the first to n-th bit lines BL1 to BLn.

During the read operation, the first to n-th page buffers PB1 to PBn may read the data DATA from the memory cells of the selected page through the first to n-th bit lines BL1 to BLn and may output the read data DATA to the input/output circuit 125 based on control of the column decoder 124.

During the erase operation, the first to n-th page buffers PB1 to PBn may float the first to n-th bit lines BL1 to BLn or may apply the erase voltage.

The column decoder 124 may transfer data between the input/output circuit 125 and the page buffer group 123 based on a column address CADD. For example, the column decoder 124 may exchange data with the first to n-th page buffers PB1 to PBn through data lines DL or may exchange data with the input/output circuit 125 through column lines CL.

The input/output circuit 125 may transfer the command CMD and the address ADDR that are received from the memory controller 200 of FIG. 1, described with reference to FIG. 1, to the control logic 130 or may exchange data DATA with the column decoder 124.

The sensing circuit 126 may generate a reference current based on a permission bit signal VRYBIT during the read operation or the verify operation and may compare a sensing voltage VPB that is received from the page buffer group 123 with a reference voltage that is generated by the reference current to output a pass signal PASS or a fail signal FAIL.

The control logic 130 may output the operation signal OPSIG, the row address RADD, the page buffer control signals PBSIGNALS, and the permission bit signal VRYBIT based on the command CMD and the address ADDR to control the peripheral circuit 120. For example, the control logic 130 may control the read operation of the selected memory block based on a sub block read command and the address. In addition, the control logic 130 may control the erase operation of the selected sub block that is included in the selected memory block based on the sub block erase command and the address. In addition, the control logic 130 may determine whether the verify operation passed or failed based on the pass signal PASS or the fail signal FAIL.

Figure 3:
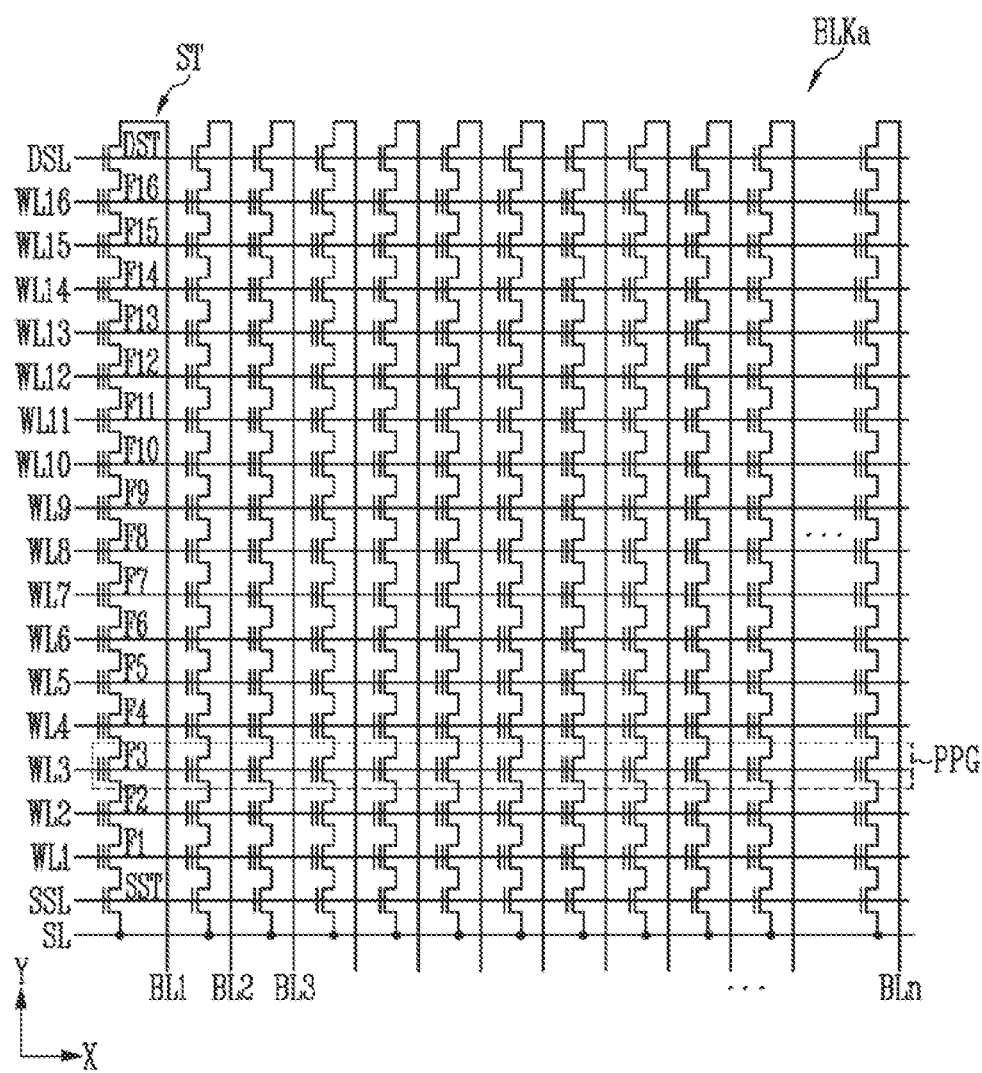
FIG. 3 is a diagram, illustrating an embodiment of a memory cell array of FIG. 2.

FIG. 3 is a diagram, illustrating an embodiment of the memory cell array of FIG. 2.

Referring to FIGS. 2 and 3, FIG. 3 is a circuit diagram that shows any one memory block BLKa, among the plurality of memory blocks BLK1 to BLKz, included in the memory cell array 110 of FIG. 2.

A first select line, word lines, and a second select line, arranged in parallel with each other, may be connected to the memory block BLKa. For example, the word lines may be arranged in parallel with each other between the first and second select lines. Here, the first select line may be the source select line SSL, and the second select line may be the drain select line DSL.

More specifically, the memory block BLKa may include a plurality of strings that are connected between the bit lines BL1 to BLn and a source line SL. The bit lines BL1 to BLn may be connected to the strings, respectively, and the source line SL may be commonly connected to the strings. Since the strings may be configured to be identical to each other, a string ST that is connected to the first bit line BL1 will be specifically described, as an example.

The string ST may include a source select transistor SST, a plurality of memory cells F1 to F16, and a drain select transistor DST that are connected in series between the source line SL and the first bit line BL1. One string ST may include at least one or more of the source select transistor SST and the drain select transistor DST. However, the present disclosure is not limited thereto, and the string ST may include more or less than the memory cells F1 to F16 that are shown in the drawing.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST that are included in the different strings may be connected to the source select line SSL, gates of the drain select transistors DST may be connected to the drain select line DSL, and gates of the memory cells F1 to F16 may be connected to a plurality of word lines WL1 to WL16. A group of the memory cells that is connected to the same word line among the memory cells that are included in different strings may be referred to as a physical page PPG. Therefore, the memory block BLKa may include the physical pages PPG of the number of the word lines WL1 to WL16.

One memory cell may store one bit of data. This is commonly referred to as a single level cell (SLC). In this case, one physical page PPG may store one logical page (LPG) data. One logical page (LPG) data may include data bits of the number of memory cells that are included in one physical page PPG. In addition, one memory cell may store two or more bits of data. This is commonly referred to as a multi-level cell (MLC). In this case, one physical page PPG may store two or more logical page (LPG) data.

A memory cell in which two or more bits of data are stored in one memory cell is referred to as a multi-level cell (MLC). However, recently, with the number of bits of data that are stored in one memory cell increasing, the multi-level cell (MLC) refers to a memory cell in which two bits of data is stored, a memory cell in which three or more bits of data are stored is referred to as a triple level cell (TLC), and a memory cell in which four or more bits of data are stored is referred to as a quadruple level cell (QLC). In addition, a memory cell method in which a plurality of bits of data are stored has been developed, and a memory cell in which two or more bits of data stored may be applied to the memory device 100 of the present embodiment.

In another embodiment, the memory block may have a three-dimensional structure. Each memory block may include a plurality of memory cells that are stacked on a substrate. Such plurality of memory cells may be arranged along a +X direction, a +Y direction, and a +Z direction.

Figure 4:
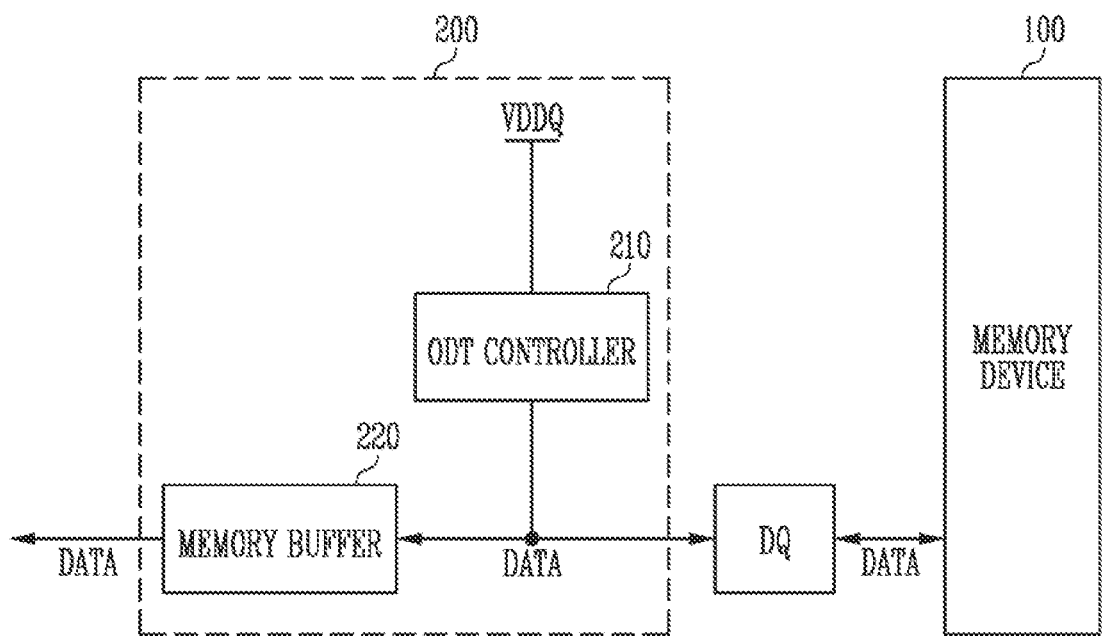
FIG. 4 is a diagram, illustrating an on die termination (ODT) operation, performed by a memory controller of FIG. 1.

FIG. 4 is a diagram, illustrating the ODT operation that is performed by the memory controller of FIG. 1.

Referring to FIG. 4, the memory controller 200 of FIG. 4 may include an ODT controller 210 and a memory buffer 220. In an embodiment, the ODT operation may be performed by the ODT controller 210. Here, the ODT controller 210 of FIG. 4 may include at least two or more of an NMOS, a PMOS, and a resistor.

For example, when the memory device 100 performs the read operation, data DATA read from the memory device 100 may be output to the memory controller 200 through an input/output line DQ. The data DATA that is output from the memory device 100 may be temporarily stored in the memory buffer 220 and then output to a host (not shown).

In an embodiment, before the read operation is performed, the ODT operation may be performed for matching of an interface that connects the memory controller 200 and the memory device 100, that is, an impedance that is viewed to the memory controller 200 and an impedance of a transmission line. Here, the ODT operation may be performed to improve signal integrity (SI).

Therefore, before performing the read operation, the ODT controller 210 may perform the ODT operation for impedance matching. For example, the ODT controller 210 may control the transmission line that is connected to the input/output line DQ to be connected to power VDDQ by turning on or turning off a switch that is connected to the power VDDQ. Here, the switch may be an NMOS and/or a PMOS.

By adjusting the impedance of the data transmission line by turning on or turning off the switch that is included in the ODT controller 210, the ODT operation that matches the impedance that is viewed to the memory controller 200 with the impedance of the transmission line may be performed.

However, when the ODT operation is performed by the ODT controller 210 as described above, an ODT pin is required for each memory controller 200 or each memory device 100. Furthermore, there is a concern that an operation that is performed on each die may be delayed in a structure in which the storage device includes a plurality of memory devices or in a structure of a plurality of dies. Therefore, the ODT operation by the ODT controller 210 may cause a performance reduction due to the burden on the hardware.

Therefore, in the present disclosure, instead of performing the ODT operation by the ODT controller 210 in the memory controller 200, a process in which the ODT operation is performed based on the signal output from the memory device 100 is presented. Furthermore, since the ODT operation may be performed by using the ready/busy pin of the memory device 100 instead of using a switch (ODT pin) in the ODT controller 210, the burden on the hardware may be reduced.

Figure 5:
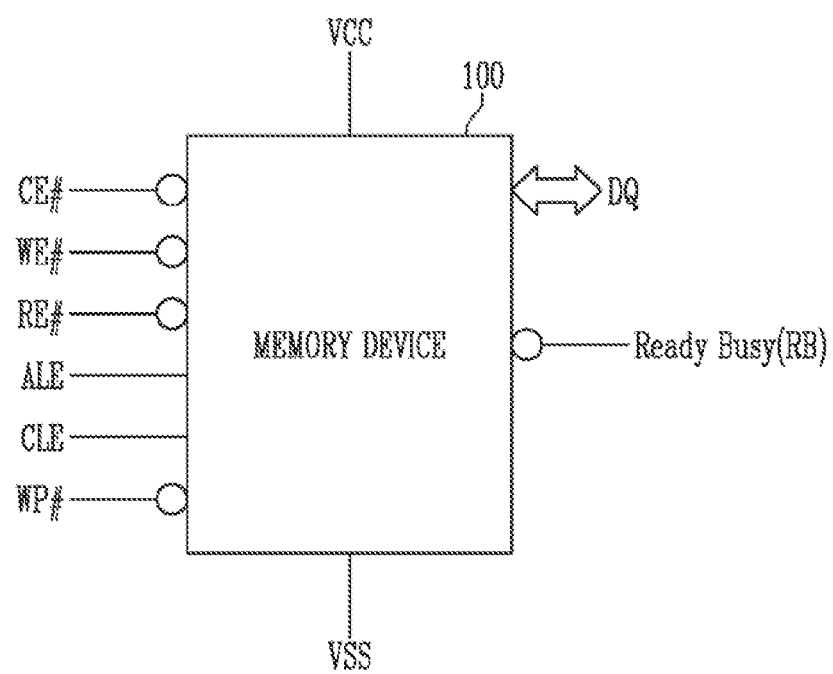
FIG. 5 is a diagram, illustrating a pin configuration of the memory device of FIG. 1.

FIG. 5 is a diagram, illustrating a pin configuration of the memory device of FIG. 1.

Referring to FIG. 5, the memory device 100 of FIG. 1 may communicate with an external controller through a plurality of input/output lines. For example, the memory device 100 of FIG. 1 may communicate with the external controller through a data input/output line DQ and control signal lines with a chip enable line CE #, a write enable line WE #, a read enable line RE #, an address latch enable line ALE, a command latch enable line CLE, a write protection line WP #, and a ready busy line RB.

The memory device 100 of FIG. 1 may receive a chip enable signal from the external controller through the chip enable line CE #. The memory device 100 of FIG. 1 may receive a write enable signal from the external controller through the write enable line WE #. The memory device 100 of FIG. 1 may receive a read enable signal from the external controller through the read enable line RE #. The memory device 100 of FIG. 1 may receive an address latch enable signal from the external controller through the address latch enable line ALE. The memory device 100 of FIG. 1 may receive a command latch enable signal from the external controller through the command latch enable line CLE. The memory device 100 of FIG. 1 may receive a write protection signal from the external controller through the write protection line WP #.

In an embodiment, the memory device 100 of FIG. 1 may provide a ready busy signal that indicates whether the memory device 100 of FIG. 1 is in a ready state or a busy state to the memory controller 200 of FIG. 1 through the ready busy line RB.

The chip enable signal may be a control signal that selects the memory device 100 of FIG. 1. When the chip enable signal is in a 'high' state and the memory device 100 of FIG. 1 corresponds to the 'ready' state, the memory device 100 of FIG. 1 may enter a low power standby state.

The write enable signal may be a control signal to control storage of the command, the address, and input data, which are input to the memory device 100 of FIG. 1, in a latch.

The read enable signal may be a control signal that enables an output of serial data.

The address latch enable signal may be one of the control signals that is used by the host to indicate whether a type of signal that is input to the input/output lines DQ is a command, an address, or data.

The command latch enable signal may be one of the control signals that is used by the host to indicate whether the type of signal that is input to the input/output lines DQ is a command, an address, or data.

For example, when the command latch enable signal is activated (for example, logic high), the address latch enable signal is deactivated (for example, logic low), and the write enable signal is activated (for example, logic low) and then deactivated (for example, logic high), the memory device 100 of FIG. 1 may identify that the signal input through the input/output lines DQ is a command.

For example, when the command latch enable signal is deactivated (for example, logic low), the address latch enable signal is activated (for example, logic high), and the write enable signal is activated (for example, logic low) and then deactivated (for example, logic high), the memory device 100 of FIG. 1 may identify that the signal input through the input/output lines DQ is an address.

The write protection signal may be a control signal that deactivates the memory device 100 of FIG. 1 to perform the program operation and the erase operation.

The ready busy signal may be a signal that identifies a state of the memory device 100 of FIG. 1. That is, the ready busy signal of a low state may indicate that the memory device 100 of FIG. 1 is performing at least one operation. The ready busy signal of a high state may indicate that the memory device 100 of FIG. 1 is not performing the operation.

The ready busy signal may be in the low state while the memory device 100 of FIG. 1 performs any one of the program operation, the read operation, and the erase operation. In an embodiment of the present disclosure, the memory controller 200 of FIG. 1 that is described with reference to FIG. 1 may determine an end time that is a time point at which the program operation or the erase operation is ended based on the ready busy signal.

Figure 6A:
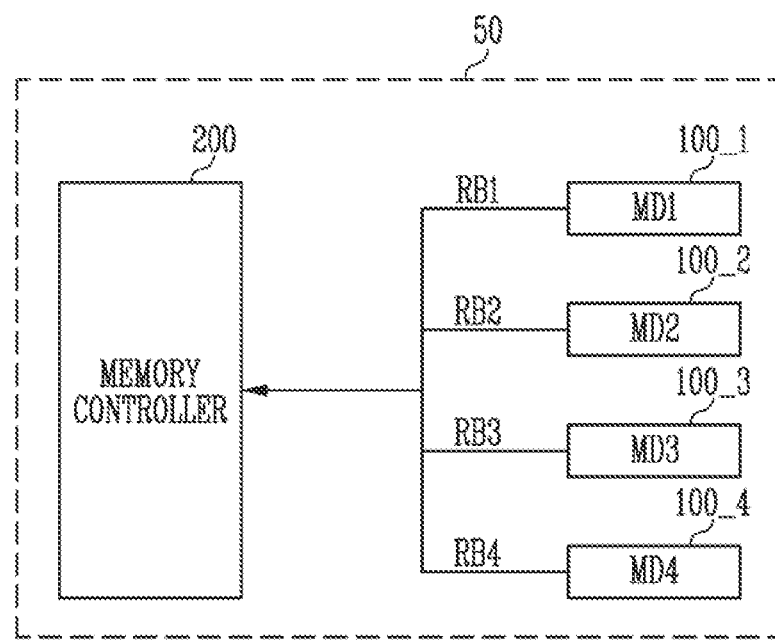

FIGS. 6A and 6B are diagrams, illustrating the target memory device and the non-target memory device when the number of memory devices of FIG. 1 is plural.

Referring to FIGS. 6A and 6B, FIG. 6A shows ready/busy signals RB1 to RB4 that is output from each memory device when the storage device 50 of FIG. 1 includes a plurality of memory devices MD1 to MD4, and FIG. 6B shows a state of a ready/busy signal RB that corresponds to each memory device and a state READY/BUSY of a memory device that corresponds to the ready/busy signal. The first to fourth memory devices MD1 to MD4 or 100_1 to 100_4 of FIG. 6A may include a plurality of memory cells in which data is stored.

In FIGS. 6A and 6B, a structure in which the storage device 50 includes the plurality of memory devices 100_1 to 100_4 is shown, but the present disclosure may be applied identically to a structure in which a plurality of dies are included in one memory device.

Figure 7:
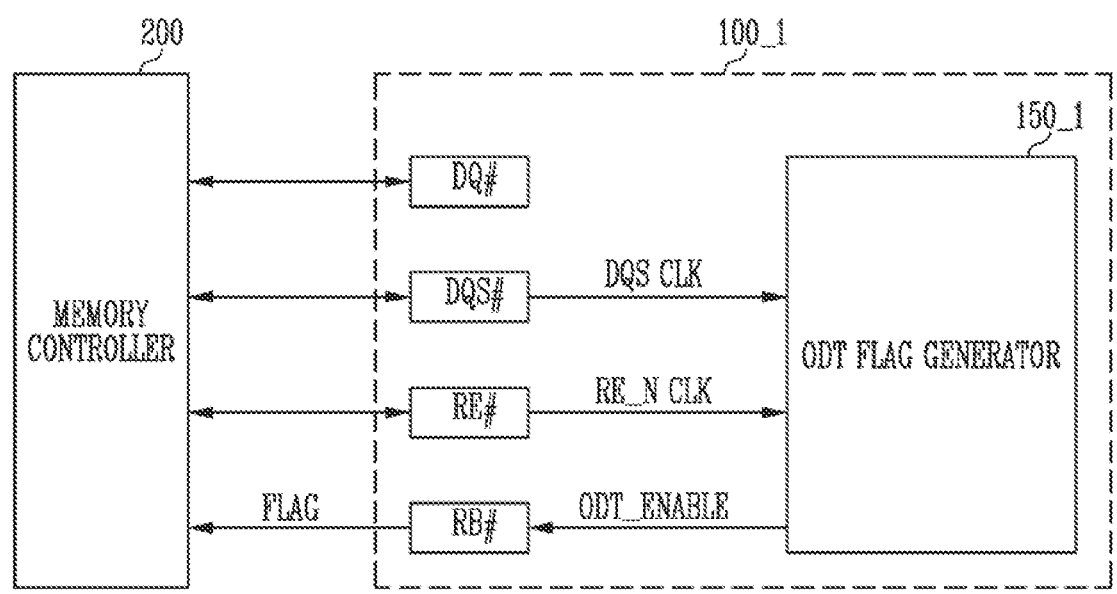
FIG. 7 is a diagram, illustrating a process of generating a flag.
Figure 9:
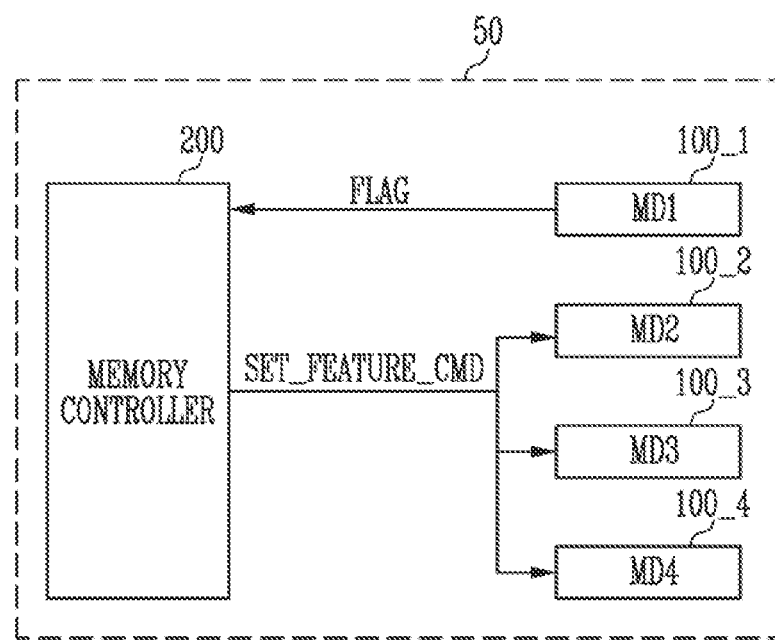
FIG. 9 is a diagram, illustrating a command that is output from the memory controller to perform the ODT operation on the non-target memory device.
Figure 10:
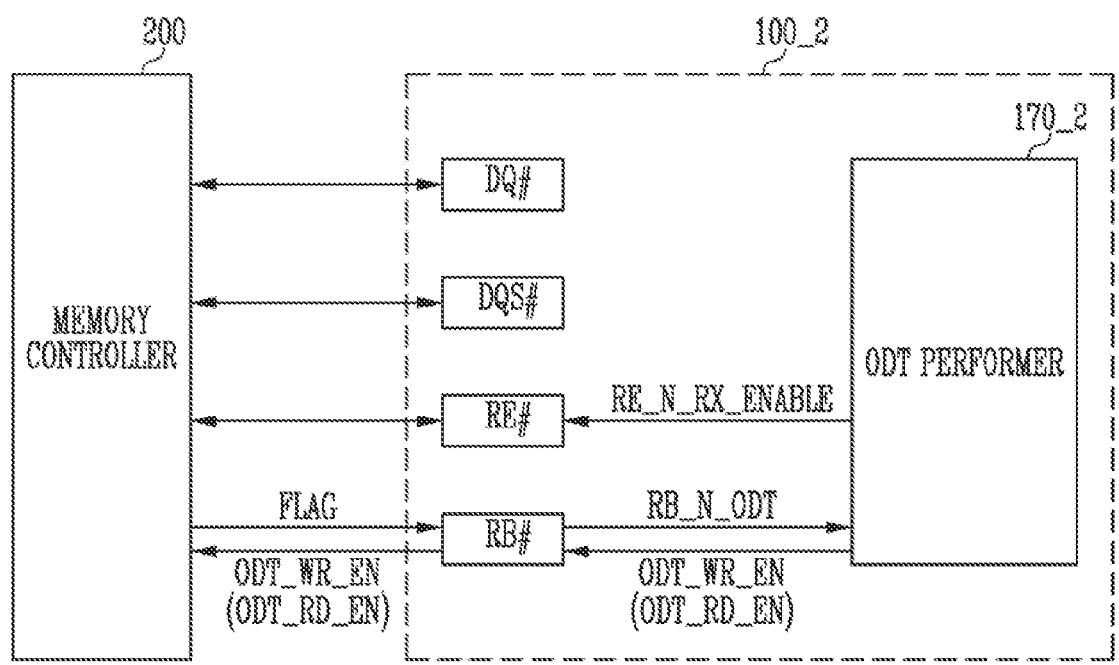
FIG. 10 illustrates a process of performing the ODT operation on the non-target memory based on the flag.

In FIGS. 6A and 6B, as well as FIGS. 7, 9, and 10, each of the multiple memory devices 100_1 to 100_4 includes an ODT flag generator and an ODT performer. For example, the first memory device 100_1 has an ODT flag generator 150_1 and an ODT performer 170_1, the second memory device 100_2 has an ODT flag generator 150_2 and an ODT performer 170_2, the third memory device 100_3 has an ODT flag generator 150_3 and an ODT performer 170_3, and the fourth memory device 100_4 has an ODT flag generator 150_4 and an ODT performer 170_4.

In FIGS. 6A and 6B, it is assumed that only the first memory device 100_1 performs an operation and the second to fourth memory devices 100_2 to 100_4 do not perform an operation among the first to fourth memory devices 100_1 to 100_4. At this time, the operation that is performed by the first memory device 100_1 may be any one of the program operation, the read operation, or the erase operation.

Therefore, since it is assumed that only the first memory device 100_1 performs the operation, the first memory device 100_1 may be the target memory device, and the second to fourth memory devices 100_2 to 100_4 may be the non-target memory devices.

In an embodiment, the first to fourth memory devices 100_1 to 100_4 may output ready/busy signals RB1 to RB4 based on a state read command that is received from the memory controller 200, respectively. The ready/busy signals RB1 to RB4 may indicate a state in which the memory device is operating or a standby state before performing the operation.

Referring to FIG. 6B, since it is assumed that only the first memory device 1001 performs the operation in FIGS. 6A and 6B, the first ready/busy signal RB1 that is output from the first memory device 100_1 may be in a low state ('0') indicating an operation state. Conversely, since it is assumed that the second to fourth memory devices 100_2 to 100_4 are in the standby state in which the operation is not performed, the second to fourth ready/busy signals RB2 to RB4 that are output from the second to fourth memory devices 100_2 to 100_4 may be in a high state ('1') that indicates a standby state.

Therefore, the first memory device 100_1 may be in a busy state BUSY, and the second to fourth memory devices 100_2 to 100_4 may be in a ready state READY.

In an embodiment, before the first memory device 100_1 is in the busy state BUSY, the first memory device 100_1 may perform the ODT operation. The ODT operation may be an operation that is performed in an initialization step to improve signal integrity (SI), and may be an operation that minimizes signal reflection or the like at an interface between the memory controller 200 and the memory devices 100_1 to 100_4.

Furthermore, the ODT operation may be an operation that sets a size of a terminating resistance (RTT) of the input/output terminals of the memory controller 200 or the plurality of memory devices 100_1 to 100_4 and may be an operation for impedance matching of a data transmission line.

In an embodiment, the ODT operation may be an ODT read operation or an ODT write operation. For example, the ODT operation that is performed before the memory device performs the read operation may be the ODT read operation, and the ODT operation that is performed before the memory device performs the write (program) operation may be the ODT write operation. That is, different impedance matching may be performed based on the operation that is performed by the memory device.

However, since it is assumed that only the first memory device 100_1 performs the operation in FIGS. 6A and 6B, the ODT operation may be performed only on the first memory device 100_1.

Therefore, in the present disclosure, a method of performing the ODT operation on the remaining second to fourth memory devices 100_2 to 1004, while the first memory device 1001 performs the operation, is provided. Furthermore, in the present disclosure, a method of performing the ODT operation through a signal output through a ready/busy pin RB # in the memory device without using an ODT pin of an ODT controller in the memory controller 200 is provided.

As a result, through the present disclosure, the ODT operation may be performed based on the signal output from the memory device. Therefore, the burden on the hardware may be reduced, and thus, the performance of the storage device 50 may be improved.

FIG. 7 is a diagram, illustrating a process of generating the flag.

Referring to FIGS. 6A, 6B, and 7, FIG. 7 shows lines that are connected to the first memory device 100_1 and the ODT flag generator 150_1 that is included in the first memory device 100_1, among the plurality of memory devices 100_1 to 100_4 of FIGS. 6A and 6B, and the memory controller 200. Similarly to FIGS. 6A and 6B, the first memory device 100_1 of FIG. 7 may be a memory device on which an operation is performed, that is, the target memory device. In FIG. 7, it is assumed that the second to fourth memory devices 100_2 to 1004, that is, the non-target memory devices on which an operation is not performed, are omitted.

In FIG. 7, it is assumed that the first memory device 1001 performs a read operation. In another embodiment, the first memory device 100_1 may perform a write (program) operation or an erase operation.

In an embodiment, when the first memory device 100_1 performs the read operation, a read enable signal RE_N CLK may be received through the read enable line RE # of FIG. 5. The read enable signal RE_N CLK may be a signal that enables the output of the data from the memory device.

In FIG. 7, since it is assumed that the first memory device 100_1 performs the read operation, an ODT read enable signal that provides instructions to perform an ODT read operation on the non-target memory devices may be generated based on the read enable signal RE_N CLK. Here, the ODT read enable signal may be a signal that leads to the enabling of the ODT read operation.

As a result, since it is assumed that the first memory device 100_1 performs the read operation, the ODT read enable signal may be generated based on the read enable signal RE_N CLK.

In another embodiment, when it is assumed that the first memory device 100_1 performs the write (program) operation, an ODT write enable signal that provides instructions to perform the ODT write operation on the non-target memory devices may be generated based on an input/output strobe signal DQS CLK. The input/output strobe signal DQS CLK may be a signal that indicates that the data that is received from the memory controller 200 is valid and may be output to the memory controller 200 through the input/output strobe line. In addition, the ODT write enable signal may be a signal that leads to the enabling of the ODT write operation.

As a result, since it is assumed that the first memory device 100_1 performs the write operation, the ODT write enable signal may be generated based on the input/output strobe signal DQS CLK.

Thereafter, when the first memory device 100_1 performs the read operation, the ODT flag generator 150_1 may output an ODT enable signal ODT_ENABLE that indicates that performing the ODT operation on the non-target memory devices is possible based on the ODT read enable signal and the read enable signal RE_N CLK. Here, the ODT_enable signal ODT_ENABLE may be output to the memory controller 200 in a form of the flag FLAG.

In an embodiment, when the memory controller 200 receives the flag FLAG from the first memory device 100_1, the target memory device, the memory controller 200 may output the flag FLAG to the second to fourth memory devices 100_2 to 100_4 so that the ODT operation is performed on the second to fourth memory devices 100_2 to 100_4, the non-target memory devices.

Figure 8:
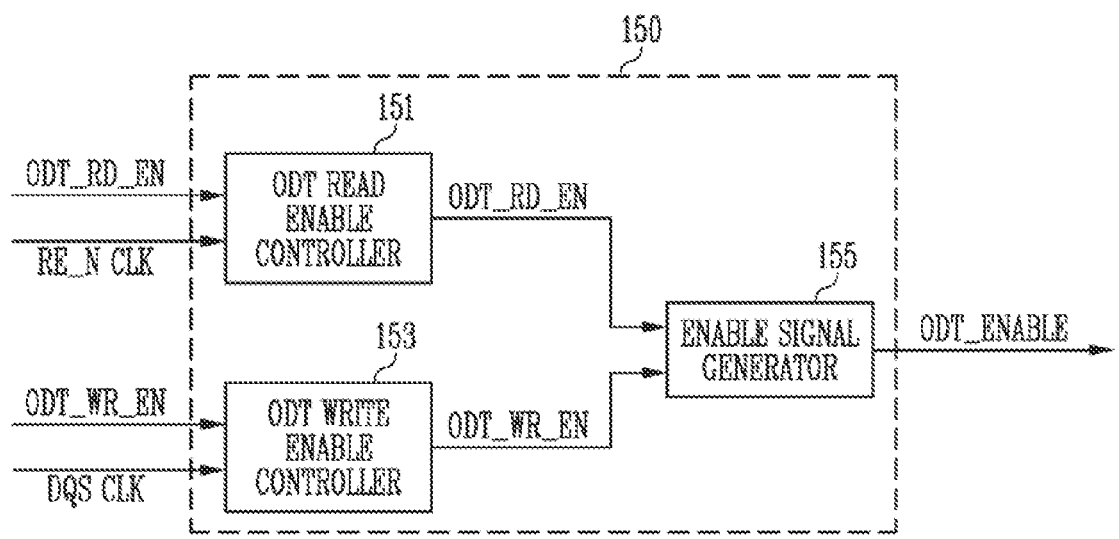
FIG. 8 is a diagram, illustrating a configuration of an ODT flag generator of FIG. 7.

FIG. 8 is a diagram, illustrating a configuration of the ODT flag generator of FIG. 7.

Referring to FIGS. 7 and 8, FIG. 8 shows an ODT read enable controller 151, an ODT write enable controller 153, and an enable signal generator 155 that are included in the ODT flag generator 150_1 of FIG. 7. FIG. 8 shows a process of outputting the ODT enable signal ODT_ENABLE of FIG. 7.

In FIG. 8, the ODT read enable controller 151 and the ODT write enable controller 153 may be configured of a D-Flip-flop, and the enable signal generator 155 may be configured of an OR gate. In another embodiment, the ODT read enable controller 151, ODT write enable controller 153, and enable signal generator 155 may be configured in various ways.

In an embodiment, when the target memory device performs the read operation, the ODT read enable signal ODT_RD_EN may be generated based on the read enable signal RE_N CLK. For example, as the target memory device performs the read operation, the read enable signal RE_N CLK may be enabled, and the ODT read enable signal ODT_RD_EN may be generated based on the enabled read enable signal RE_N CLK.

In an embodiment, when the target memory device performs the write (program) operation, an ODT write enable signal ODT_WR_EN may be generated based on the input/output strobe signal DQS CLK. For example, as the target memory device performs the write (program) operation, the input/output strobe signal DQS CLK may be enabled, and the ODT write enable signal ODT_WR_EN may be generated based on the enabled input/output strobe signal DQS CLK.

In an embodiment, the enabled read enable signal RE_N CLK and the ODT read enable signal ODT_RD_EN may be input to the ODT read enable controller 151, and the ODT read enable signal ODT_RD_EN may be output from the ODT read enable controller 151. In addition, the enabled input/output strobe signal DQS CLK and the ODT write enable signal ODT_WR_EN may be input to the ODT write enable controller 153, and the ODT write enable signal ODT_WR_EN may be output from the ODT write enable controller 153.

The ODT read enable signal ODT_RD_EN and the ODT write enable signal ODT_WR_EN may be input to the enable signal generator 155, and the enable signal generator 155 may output the ODT enable signal ODT_ENABLE that indicates that the performance of the ODT operation on the non-target memory device is possible.

That is, when the target memory device performs the read operation, the ODT read enable signal ODT_RD_EN may be output from the ODT read enable controller 151, and when the target memory device performs the write operation, the ODT write enable signal ODT_WR_EN may be output from the ODT write enable controller 153. Thereafter, when the enable signal generator 155 receives any one of the ODT read enable signal ODT_RD_EN and the ODT write enable signal ODT_WR_EN, the enable signal generator 155 may output the ODT enable signal ODT_ENABLE so that the ODT operation is performed on the non-target memory devices.

FIG. 9 is a diagram, illustrating a command that is output from the memory controller to perform the ODT operation on the non-target memory device.

Referring to FIGS. 6A, 6B and 9, FIG. 9 shows the same configuration as that of the storage device 50 of FIG. 6A. In addition, similarly to FIGS. 6A and 6B, it is assumed that only the first memory device 100_1 of the first to fourth memory devices 100_1 to 100_4 of FIG. 9 performs the operation. That is, it is assumed that the first memory device 100_1 is the target memory device, and the second to fourth memory devices 100_2 to 100_4 are the non-target memory devices among the first to fourth memory devices 100_1 to 100_4.

FIG. 9 shows that after the memory controller 200 receives the flag FLAG from the first memory device 100_1, the memory controller 200 may output a parameter setting command SET_FEATURE_CMD to perform the ODT operation on the second to fourth memory devices 100_2 to 100_4, that is, the non-target memory devices. Here, the flag FLAG may indicate that the ODT operation may be performed on the non-target memory devices. Furthermore, the target memory device and the non-target memory device may be distinguished based on the flag FLAG.

In an embodiment, the memory controller 200 may receive the flag FLAG from the first memory device 100_1, which is the target memory device, and then output the parameter setting command SET_FEATURE_CMD to the second to fourth memory devices 100_2 to 100_4. The parameter setting command SET_FEATURE_CMD may be a command that provides instructions to the second to fourth memory devices 100_2 to 100_4 to perform only the ODT operations and not perform any other operation.

Therefore, after the memory controller 200 outputs the parameter setting command SET_FEATURE_CMD to the second to fourth memory devices 100_2 to 100_4, a signal that indicates that the ODT operation may be performed on the non-target memory devices and a signal that sets a parameter value so that another operation except for the ODT operation might not be performed may be output.

FIG. 10 illustrates a process of performing the ODT operation on the non-target memory based on the flag.

Referring to FIG. 10, FIG. 10 shows the memory controller 200 that is included in the storage device and the second memory device 100_2 that is the non-target memory device among the plurality of memory devices 100_1 to 100_4. In addition to the second memory device 100_2, contents of the present drawing may be applied to the third and fourth memory devices 100_3 and 100_4, which are also non-target memory devices.

FIG. 10 shows lines that are connected to the second memory device 100_2 and an ODT performer 170_2, included in the second memory device 100_2, and the memory controller 200.

In an embodiment, the second memory device 100_2 that is the non-target memory device may receive the flag FLAG from the memory controller 200 through the ready/busy line RB #. The flag FLAG may indicate that the ODT operation on the non-target memory device or the non-target die may be performed, and furthermore, the target memory device and the non-target memory device may be distinguished based on the flag FLAG.

When the second memory device 100_2 receives the flag FLAG from the memory controller 200, an ODT ready/busy signal RB_N_ODT that provides instructions to perform the ODT operation may be generated based on the flag FLAG. The ODT performer 170_2 may perform the ODT operation based on the ODT ready/busy signal RB_N_ODT.

For example, the ODT performer 170_2 may output a buffer enable signal RE_N_RX_ENABLE to operate a memory buffer in which data is temporarily stored based on the ODT ready/busy signal RB_N_ODT and a delay signal DELAY_SIG that is obtained by delaying the ODT ready/busy signal RB_N_ODT. When the buffer enable signal is transferred to the memory controller 200 through the read enable line RE #, the memory buffer in which data in the memory controller 200 is temporarily stored may be operated.

Thereafter, the ODT performer 170_2 may generate the ODT read enable signal ODT_RD_EN, for controlling to perform the ODT read operation based on the ODT ready/busy signal RB_N_ODT, the delay signal DELAY_SIG, and the buffer enable signal RE_N_RX_ENABLE. Alternatively, the ODT write enable signal ODT_WR_EN may be generated based on the ODT ready/busy signal RB_N_ODT and the ODT read enable signal ODT_RD_EN.

In an embodiment, when the generated ODT read enable signal ODT_RD_EN or ODT write enable signal ODT_WR_EN is output to the memory controller 200 through the ready/busy line RB #, the memory controller 200 may perform the ODT read operation or the ODT write operation. The ODT read operation may be the ODT operation that is performed for impedance matching before the memory device performs the read operation, and the ODT write operation may be the ODT operation that is performed for impedance matching before the memory device performs the write (program) operation. That is, different impedance matching may be performed based on the operation that is performed by the memory device.

Figure 11:
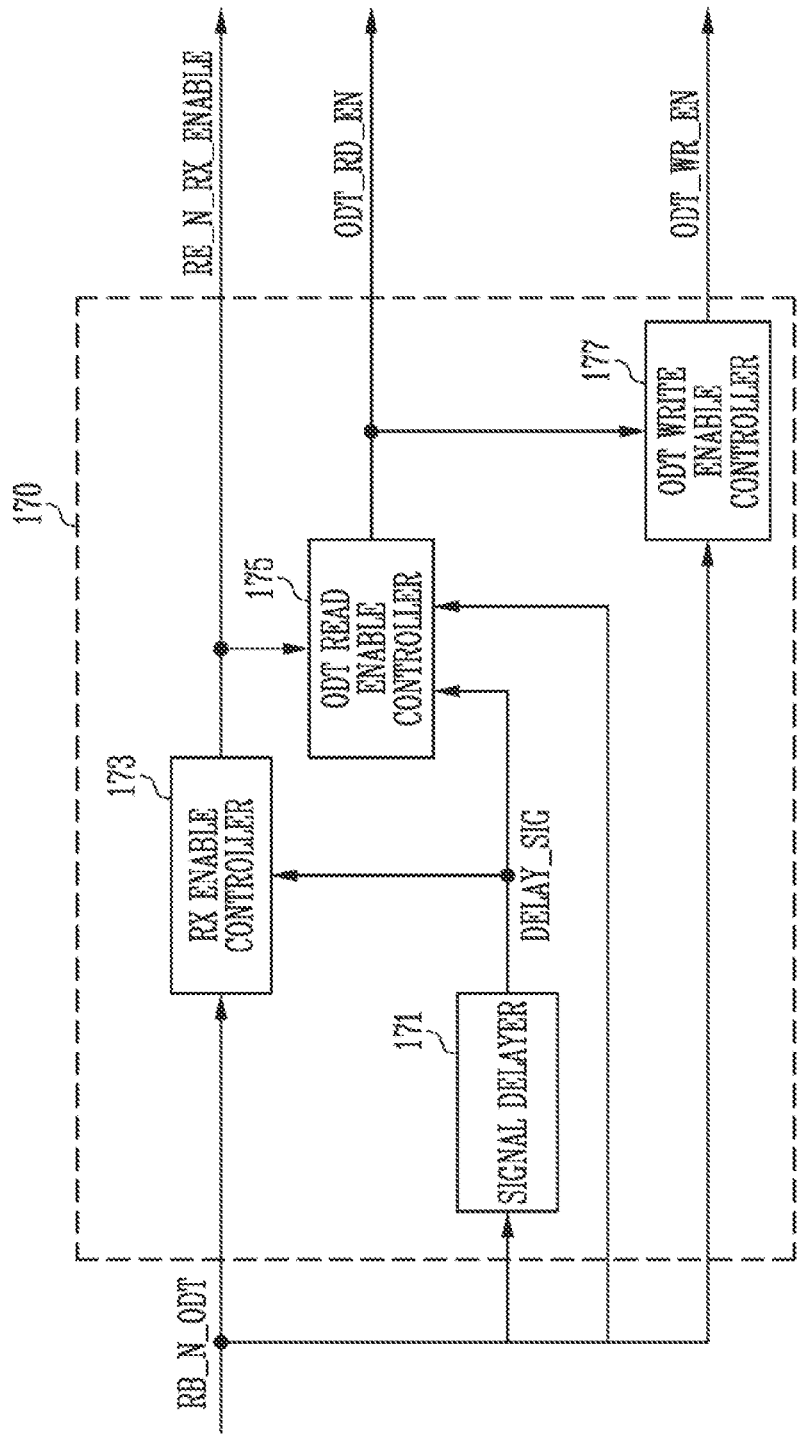
FIG. 11 is a diagram, illustrating a configuration of an ODT performer of FIG. 10.

FIG. 11 is a diagram, illustrating a configuration of the ODT performer of FIG. 10.

Referring to FIGS. 10 and 11, FIG. 11 shows a signal delayer 171, an RX enable controller 173, an ODT read enable controller 175, and an ODT write enable controller 177 that is included in the ODT performer 170_2 of FIG. 10.

In an embodiment, the RX enable controller 173 and the ODT write enable controller 177 may be configured of an inverter, that is, a NOT gate and a negative-AND (NAND) gate, and the ODT read enable controller 175 may be configured of an exclusive-OR (XOR) gate and a D-Latch (DLAT). In various embodiments, the signal delayer 171, the RX enable controller 173, the ODT read enable controller 175, and the ODT write enable controller 177 may be configured in various ways.

The ODT performer 170_2 may receive the ODT ready/busy signal RB_N_ODT through the ready/busy line RB #. The received ODT ready/busy signal RB_N_ODT may be a signal that provides instructions to perform the ODT operation. The ODT ready/busy signal RB_N_ODT may be output to all components 171 to 177 that are included in the ODT performer 170_2.

In an embodiment, the signal delayer 171 may generate the delay signal DELAY_SIG that is obtained by delaying the ODT ready/busy signal RB_N_ODT. The delay signal DELAY_SIG may be output to the RX enable controller 173 and the ODT read enable controller 175.

In an embodiment, the RX enable controller 173 may output the buffer enable signal RE_N_RX_ENABLE based on the ODT ready/busy signal RB_N_ODT and the delay signal DELAY_SIG. The buffer enable signal RE_N_RX_ENABLE may enable the memory buffer that temporarily stores data to operate.

In an embodiment, the ODT read enable controller 175 may generate the ODT read enable signal ODT_RD_EN based on the buffer enable signal RE_N_RX_ENABLE, the delay signal DELAY_SIG, and the ODT ready/busy signal RB_N_ODT output from the RX enable controller 173. That is, after the memory buffer in which data is to be temporarily stored is turned on, the ODT read enable controller 175 may generate the ODT read enable signal ODT_RD_EN that controls to perform the ODT read operation and output the ODT read enable signal ODT_RD_EN to the memory controller 200 of FIG. 10. The ODT read operation may be the ODT operation that is performed for impedance matching before the memory device performs the read operation.

In an embodiment, the ODT write enable controller 177 may generate the ODT write enable signal ODT_WR_EN based on the ODT read enable signal ODT_RD_EN and the ODT ready/busy signal RB_N_ODT that is output from the ODT read enable controller 175. That is, after the memory buffer in which data is to be temporarily stored is turned on, the ODT write enable controller 177 may generate the ODT write enable signal ODT_WR_EN that controls to perform the ODT write operation and may output the ODT write enable signal ODT_WR_EN to the memory controller 200 of FIG. 10. The ODT write operation may be the ODT operation that is performed for impedance matching before the memory device performs the write (program) operation.

In an embodiment, when receiving the flag FLAG from the memory controller 200 of FIG. 10, the ODT write enable signal ODT_WR_EN may be generated so that the ODT write operation is first performed based on the ODT ready/busy signal RB_N_ODT. That is, until the ODT read enable signal ODT_RD_EN that performs the ODT read operation is received from the ODT read enable controller 175, the ODT write enable controller 177 may generate the ODT write enable signal ODT_WR_EN that controls to perform the ODT write operation.

Figure 12:
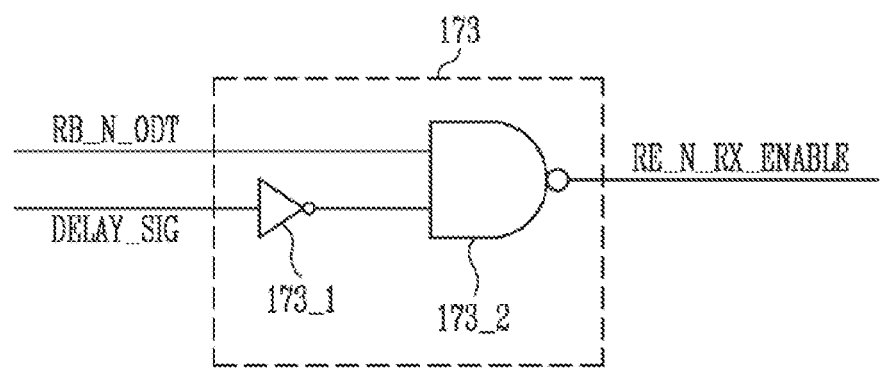
FIG. 12 is a diagram, illustrating a configuration of an RX enable controller of FIG. 11.

FIG. 12 is a diagram, illustrating a configuration of the RX enable controller of FIG. 11.

Referring to FIGS. 11 and 12, the RX enable controller 173 of FIG. 12 may be configured of an inverter 173_1, that is, a NOT gate and a negative-AND (NAND) gate 173_2. The inverter 173_1 may invert and output an input signal, and the NAND gate 1732 may be a gate that outputs '0' when both of the input signals are '1'.

In an embodiment, the RX enable controller 173 may output the buffer enable signal RE_N_RX_ENABLE based on the ODT ready/busy signal RB_N_ODT and the delay signal DELAY_SIG. The ODT ready/busy signal RB_N_ODT may be a signal that provides instructions to perform the ODT operation, and the delay signal DELAY_SIG may be the signal that is obtained by delaying the ODT ready/busy signal RB_N_ODT.

For example, the delay signal DELAY_SIG may be input to the inverter 173_1. That is, when the delay signal DELAY_SIG is in a high state ('1'), a signal in a low state ('0') may be input to the NAND gate 1732, and when the delay signal DELAY_SIG is in a low state ('0'), a signal in a high state ('1') may be input to the NAND gate 173_2.

Thereafter, the ODT ready/busy signal RB_N_ODT and a signal output from the inverter 173_1 may be input to the NAND gate 173_2. Therefore, when both of the ODT ready/busy signal RB_N_ODT and the delay signal DELAY_SIG are in a low state ('0'), the buffer enable signal RE_N_RX_ENABLE for operating the memory buffer may be output.

Figure 13:
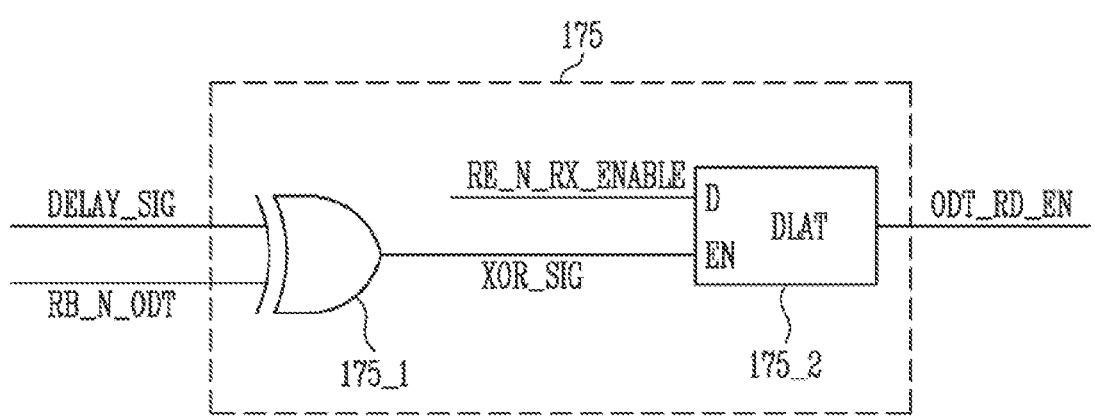
FIG. 13 is a diagram, illustrating a configuration of an ODT read enable controller of FIG. 11.

FIG. 13 is a diagram, illustrating a configuration of the ODT read enable controller of FIG. 11.

Referring to FIGS. 11 and 13, the ODT read enable controller 175 of FIG. 13 may be configured of an XOR gate 175_1 and a DLAT 175_2. The XOR gate 175_1 may be a gate that outputs '1' only when two input signals are in different states, and the DLAT 175_2 may be an element that outputs an input signal as it is in an enabled state.

In an embodiment, the ODT read enable controller 175 may generate the ODT read enable signal ODT_RD_EN based on the buffer enable signal RE_N_RX_ENABLE, the delay signal DELAY_SIG, and the ODT ready/busy signal RB_N_ODT that are output from the RX enable controller 173. The buffer enable signal RE_N_RX_ENABLE may be a signal that controls to turn on the memory buffer in which data is temporarily stored, the ODT ready/busy signal RB_N_ODT may be a signal that provides instructions to perform the ODT operation, and the delay signal DELAY_SIG may be a signal that is obtained by delaying the ODT ready/busy signal RB_N_ODT.

For example, the ODT ready/busy signal RB_N_ODT and the delay signal DELAY_SIG that are obtained by delaying the ODT ready/busy signal RB_N_ODT may be input to the XOR gate 175_1. That is, only when one of the ODT ready/busy signal RB_N_ODT and the delay signal DELAY_SIG is '1', the ODT read enable signal ODT_RD_EN may be generated.

When any one of the ODT ready/busy signal RB_N_ODT and delay signal DELAY_SIG is '1', a signal XOR_SIG that is output from the XOR gate may be '1', and the signal XOR_SIG may enable the DLAT 175_2.

Thereafter, when the DLAT 175_2 is enabled, the ODT read enable controller 175 may output the ODT read enable signal ODT_RD_EN based on the buffer enable signal RE_N_RX_ENABLE.

As a result, only when any one of the ODT ready/busy signal RB_N_ODT and the delay signal DELAY_SIG is '1', the ODT read operation may be performed.

Figure 14:
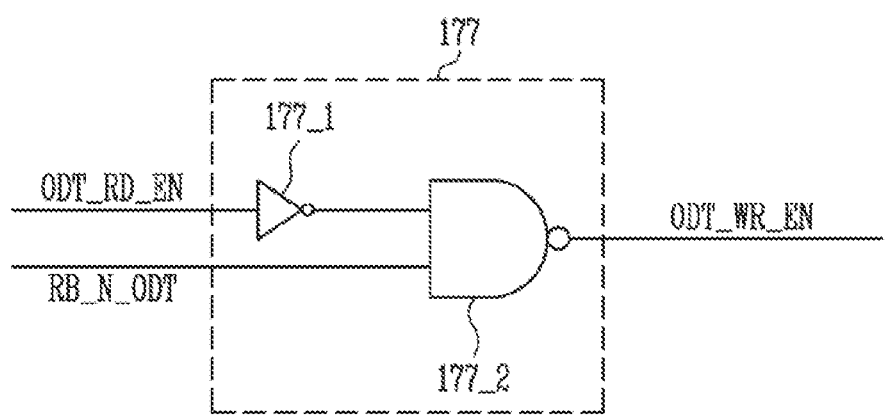
FIG. 14 is a diagram, illustrating a configuration of an ODT write enable controller of FIG. 11.

FIG. 14 is a diagram, illustrating a configuration of the ODT write enable controller of FIG. 11.

Referring to FIGS. 11 and 14, the ODT write enable controller 177 of FIG. 14 may be configured of an inverter 1771, that is, a NOT gate and a negative-AND (NAND) gate 177_2. The inverter 177_1 may invert and output an input signal, and the NAND gate 177_2 may be a gate that outputs '0' when both of two input signals are '1'.

In an embodiment, the ODT write enable controller 177 may output the ODT write enable signal ODT_WR_EN based on the ODT read enable signal ODT_RD_EN and the ODT ready/busy signal RB_N_ODT that are output from the ODT read enable controller 175. The ODT ready/busy signal RB_N_ODT may be the signal that provides instructions to perform the ODT operation, and the ODT read enable signal ODT_RD_EN may be the signal that provides instructions to perform the ODT read operation that is performed for impedance matching before the memory device performs the read operation.

For example, the ODT read enable signal ODT_RD_EN may be input to the inverter 177_1.

Since the ODT read enable signal ODT_RD_EN is not generated before the ODT read operation is performed, the ODT write enable signal ODT_WR_EN in a high state ('1') may be output, and thus, the ODT write operation may be performed.

However, when it is determined that the ODT read operation is performed, the ODT read enable signal ODT_RD_EN in a low state ('0') may be input to the inverter 177_1, and an inverted signal may be input to the NAND gate 177_2. Therefore, the ODT write enable signal ODT_WR_EN may be disabled.

Figure 15:
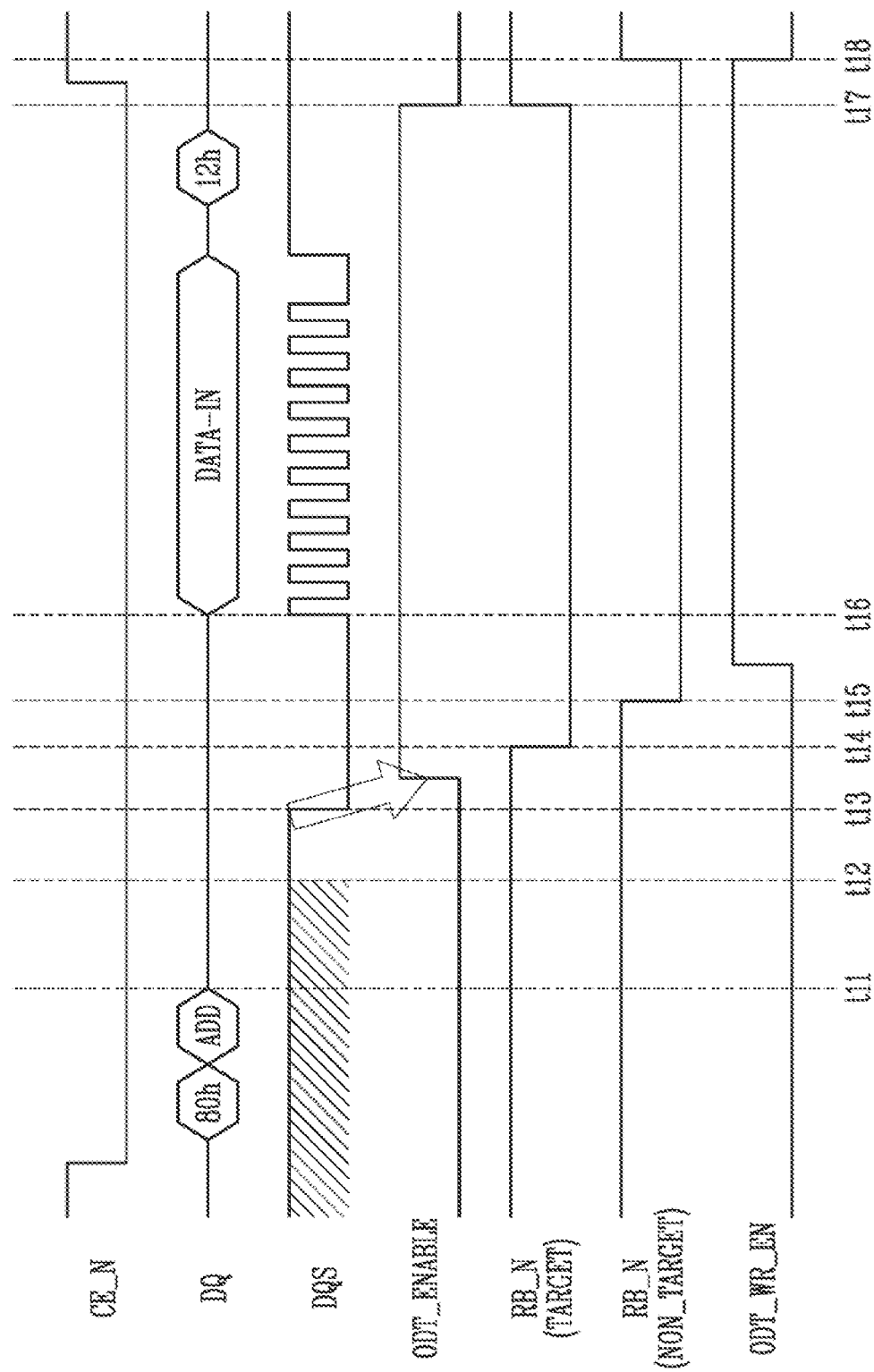
FIG. 15 is a timing diagram, illustrating an ODT write operation.

FIG. 15 is a timing diagram, illustrating the ODT write operation.

Referring to FIG. 15, FIG. 15 shows a state of each signal when the ODT write operation is performed on the non-target memory device NON_TARGET. In FIG. 15, the non-target memory device NON_TARGET may be the memory device or die in which the operation is not performed, and a CE_N signal for selecting the memory device or die in which the operation is not performed may maintain a low state during the ODT write operation.

In the following drawing, it is assumed that the target is the target memory device TARGET, and the non-target is the non-target memory device NON_TARGET. In another embodiment, the target may be the target die, and the non-target may be the non-target die.

In an embodiment, the target memory device TARGET may receive commands 80h and 12h, an address ADD, and data DATA-IN through the input/output pin DQ or the input/output line DQ so that the ODT write operation is performed. In addition, when the commands 80h and 12h, the address ADD, or the data DATA-IN is received, the input/output strobe signal DQS, indicating that corresponding commands 80h and 12h, address ADD, or data DATA-IN is valid may be in a high state.

When the input/output strobe signal DQS in a low state is received from the memory controller 200 of FIG. 1 during the write (program) operation (t13), the target memory device TARGET may output the ODT enable signal ODT_ENABLE, indicating that the ODT operation on the non-target memory device NON_TARGET is possible. Here, the ODT enable signal ODT_ENABLE may be output to the memory controller 200 in the form of the flag FLAG.

In an embodiment, since the ODT operation may be performed only while the target memory device TARGET is operating, the ODT enable signal ODT_ENABLE may maintain a high state from time t13, when the input/output strobe signal DQS is in a low state, to time t17, when an input of data is completed.

Thereafter, while the target memory device TARGET performs the write (program) operation, the ready/busy signal RB_N for the target memory device TARGET may be in a low state indicating the busy state (time t14 to time t17).

Immediately after the target memory device TARGET starts the operation, the ready/busy signal RB_N for the non-target memory device NON_TARGET may also be in a low state indicating the busy state while the ODT operation is performed (time t15). When the ready/busy signal RB_N for the non-target memory device NON_TARGET is in the low state, the ODT write enable signal ODT_WR_EN that provides instructions to perform the ODT operation on the non-target memory device NON_TARGET may be in a high state, and thus, the ODT write operation may be performed.

Figure 16:
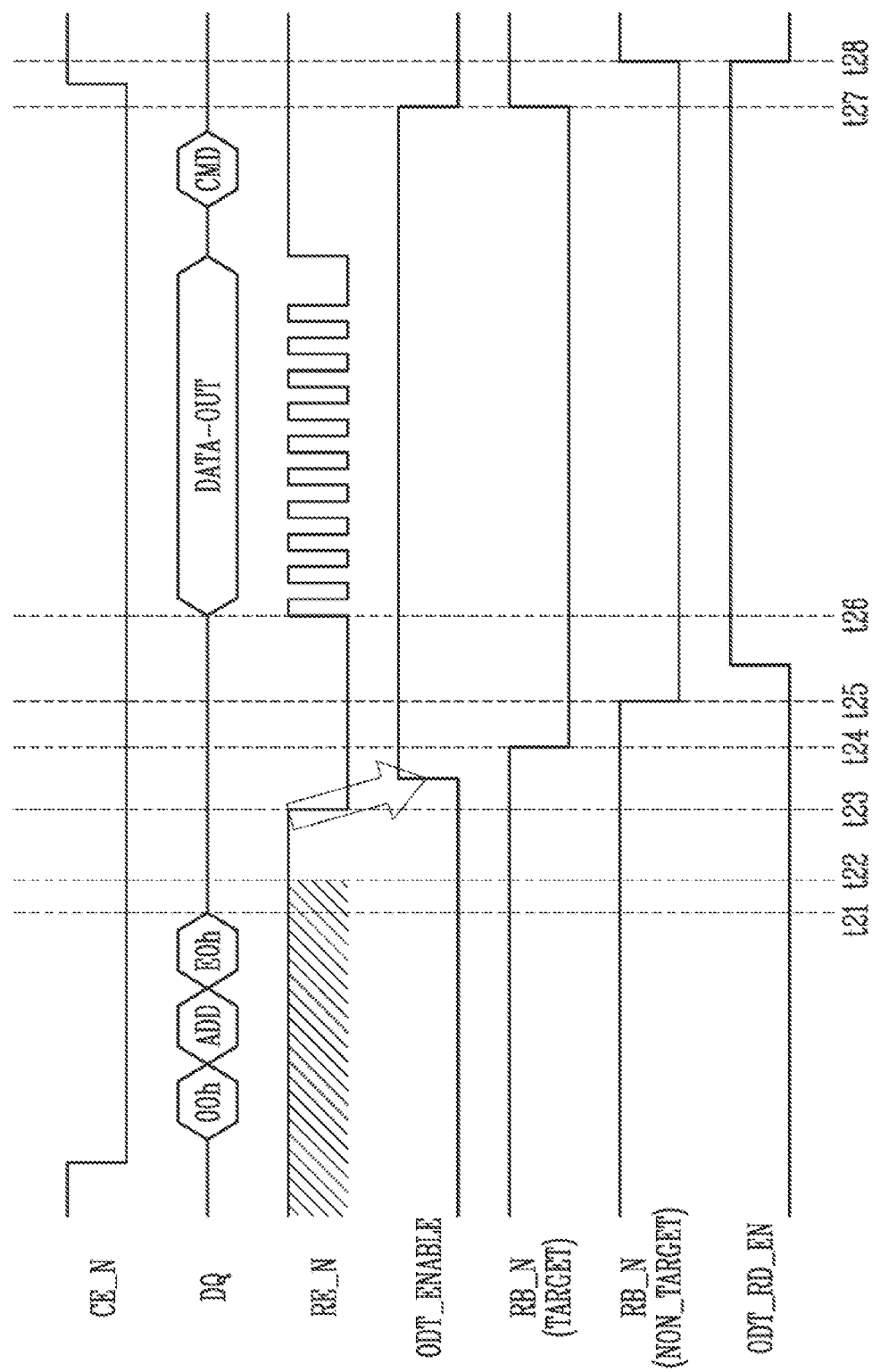
FIG. 16 is a timing diagram, illustrating an ODT read operation.

FIG. 16 is a timing diagram, illustrating the ODT read operation.

Referring to FIG. 16, FIG. 16 shows a state of each signal when the ODT read operation is performed on the non-target memory device NON_TARGET. In FIG. 16, the non-target memory device NON_TARGET may be the memory device or die in which the operation is not performed, and a CE_N signal that selects the memory device or die in which the operation is not performed may maintain a low state during the ODT read operation.

In an embodiment, the target memory device TARGET may receive commands 00h and CMD and an address ADD and may output data to the memory device (DATA-OUT) through the input/output pin DQ so that the ODT read operation is performed. In addition, when the commands 00h and CMD and the address ADD are received, the RE_N signal may be in a high state.

When the RE_N signal in a low state for enabling the read operation is received (time t23), the target memory device TARGET may output the ODT enable signal ODT_ENABLE that indicates that the ODT operation on the non-target memory device NON_TARGET may be performed. Here, the ODT enable signal ODT_ENABLE may be output to the memory controller 200 in the form of the flag FLAG.

In an embodiment, since the ODT operation may be performed only while the target memory device TARGET is operating, the ODT enable signal ODT_ENABLE may maintain a high state from time t23, when the RE_N signal becomes a low state, to time t27, when an output of data is completed.

Thereafter, while the target memory device TARGET performs the read operation, the ready/busy signal RB_N for the target memory device TARGET may be in a low state indicating the busy state (time t24 to time t27).

Immediately after the target memory device TARGET starts the operation, the ready/busy signal RB_N for the non-target memory device NON_TARGET may also be in a low state that indicates the busy state while the ODT operation is performed (time t25). When the ready/busy signal RB_N for the non-target memory device NON_TARGET is in the low state, the ODT read enable signal ODT_RD_EN that provides instructions to perform the ODT operation on the non-target memory device NON_TARGET may be in a high state, and thus, the ODT read operation may be performed.

Figure 17:
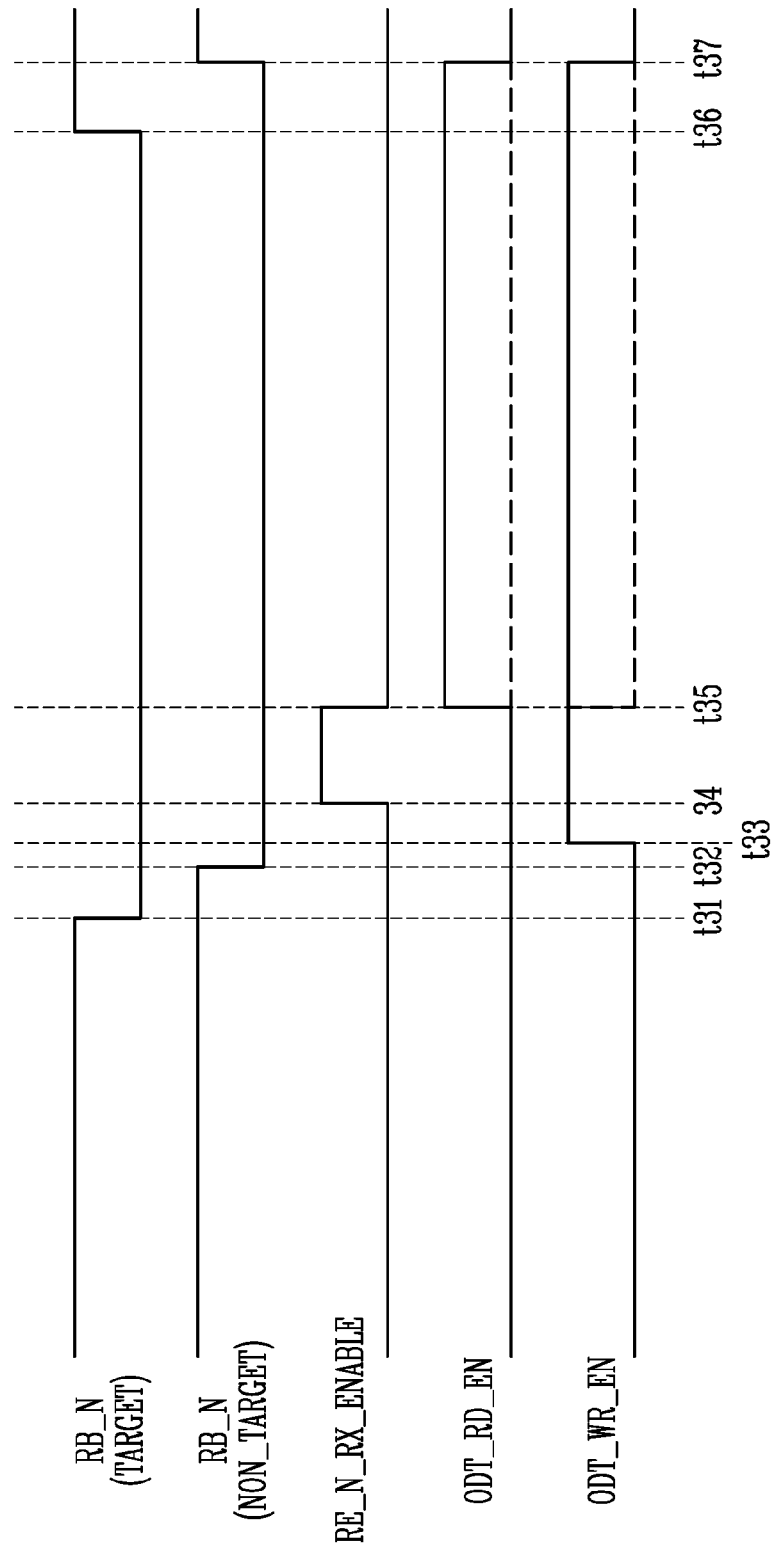
FIG. 17 is a timing diagram, illustrating the ODT write operation and the ODT operation.

FIG. 17 is a timing diagram, illustrating the ODT write operation and the ODT operation.

Referring to FIG. 17, FIG. 17 shows a state of signals that are output from the target memory device TARGET and the non-target memory device NON_TARGET.

In an embodiment, when the target memory device TARGET performs the operation, the RB_N signal of the target memory device TARGET may be in a low state (time t31 to time t36).

In the present disclosure, when the target memory device TARGET performs the operation, since the ODT operation on the non-target memory device NON_TARGET is performed, while the ODT operation on the non-target memory device NON_TARGET is performed, the RB_N signal for the non-target memory device NON_TARGET may also be in a low state (time t32 to time t37).

In an embodiment, when the RB_N signal of the non-target memory device NON_TARGET is in the low state, the ODT operation may be performed. Therefore, the RE_N_RX_ENABLE signal that turns on the memory buffer in which data is to be temporarily stored during the ODT read operation or the ODT write operation may be in a high state at time t34 to time t35.

Before the target memory device TARGET performs the read operation, after the non-target memory device NON_TARGET may receive the flag FLAG that indicates that the ODT operation may be performed from the memory controller 200 of FIG. 1 the ODT write enable signal ODT_WR_EN in a high state for enabling the ODT write operation may be output to the memory controller 200 of FIG. 1 (time t33).

In an embodiment, at time t35, when the target memory device TARGET performs the read operation, the ODT read enable signal ODT_RD_EN may be output in a high state to enable the ODT read operation. In addition, as the ODT write enable signal ODT_WR_EN in a low state is output, the ODT write operation may be disabled. However, when the target memory device TARGET does not perform the read operation, the ODT write enable signal ODT_WR_EN may maintain a high state until the target memory device TARGET completes the write operation (time t33 to time t37).

Figure 18:
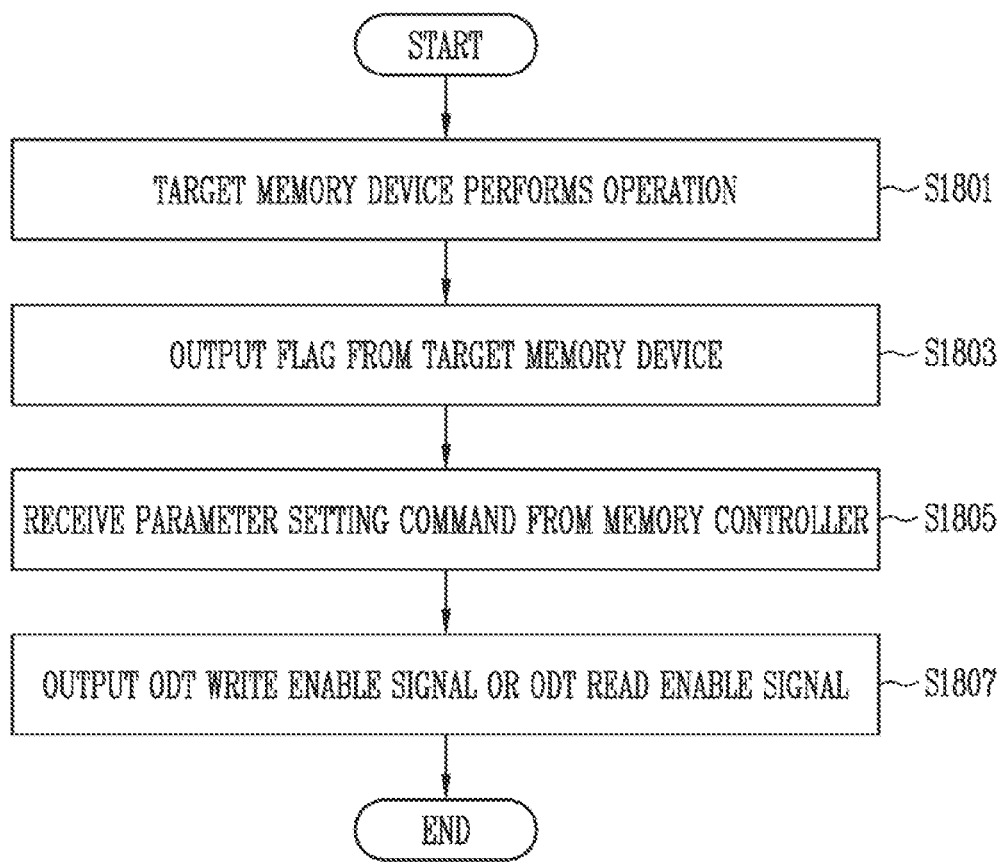
FIG. 18 is a diagram, illustrating an operation of the memory device according to an embodiment of the present disclosure.

FIG. 18 is a diagram, illustrating an operation of the memory device, according to an embodiment of the present disclosure.

Referring to FIG. 18, in step S1801, the target memory device may perform the operation. The operation that is performed by the target memory device may be any one of a program operation, a read operation, and an erase operation.

In step S1803, the flag may be output from the target memory device. The flag may indicate that the ODT operation on the non-target memory device or the non-target die may be performed. Furthermore, the target memory device and the non-target memory devices may be distinguished based on the flag. Here, the target memory device may be the memory device in the busy state in which the operation is performed, and the non-target memory device may be the memory device in the ready state in which the operation is not performed.

In the present disclosure, when the operation is performed on the target memory device, the ODT operation may be performed on the non-target memory devices.

In step S1805, the parameter setting command may be received from the memory controller. At this time, the non-target memory devices may receive the parameter setting command from the memory controller. After receiving the parameter setting command, only operations for the ODT operation may be performed on the non-target memory devices, and other operations may not be performed.

In step S1807, the memory device may output the ODT write enable signal or the ODT read enable signal.

In an embodiment, when the target memory device performs the write operation, the memory device may output the ODT write enable signal that requests to perform the ODT write operation on the non-target memory device based on the flag that is received from the memory controller.

In addition, when the target memory device performs the read operation, the memory device may output the ODT read enable signal that requests to perform the ODT read operation on the non-target memory device based on the flag that is received from the memory controller.

Figure 19:
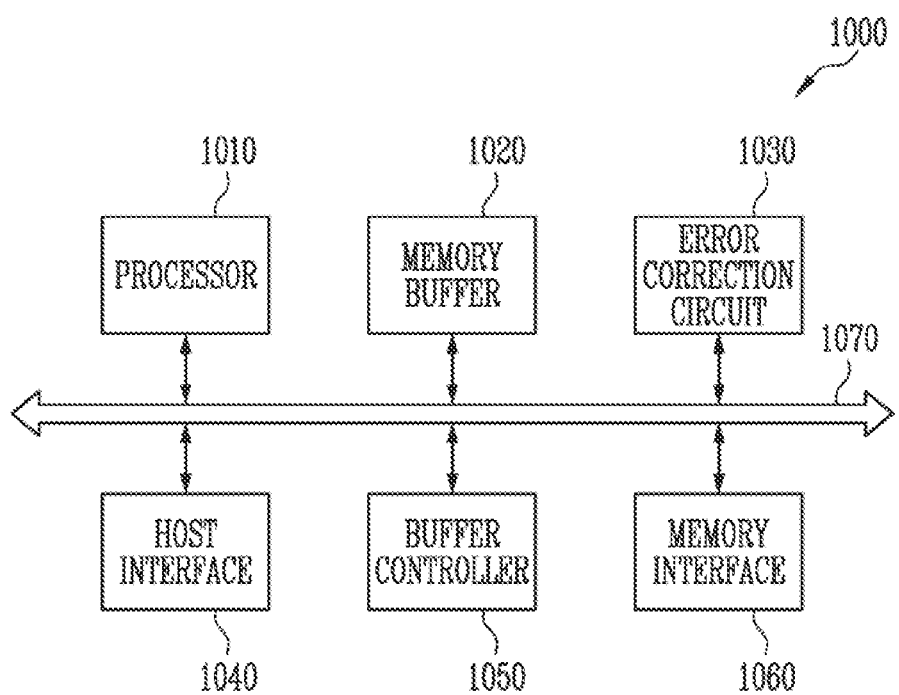
FIG. 19 is a diagram, illustrating another embodiment of the memory controller of FIG. 1.

FIG. 19 is a diagram, illustrating another embodiment of the memory controller of FIG. 1.

The memory controller 1000 may be connected to a host and the memory device. The memory controller 1000 may be configured to access the memory device based on the request from the host Host. For example, the memory controller 1000 may be configured to control write, read, erase, and background operations of the memory device. The memory controller 1000 may be configured to provide an interface between the memory device and the host. The memory controller 1000 may be configured to drive the firmware to control the memory device.

Referring to FIG. 19, the memory controller 1000 may include a processor 1010, a memory buffer 1020, an error correction circuit (ECC) 1030, a host interface 1040, a buffer controller (or buffer control circuit) 1050, a memory interface 1060, and a bus 1070.

The bus 1070 may be configured to provide a channel between components of the memory controller 1000.

The processor 1010 may control overall operations of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device by using the memory buffer 1020 as an operation memory, a cache memory, or a buffer memory.

The processor 1010 may perform a function of the FTL. The processor 1010 may translate the LBA provided by the host into the PBA through the FTL. The FTL may receive the LBA and may translate the LBA into the PBA by using a mapping table. An address mapping method of the flash translation layer may include a plurality of mapping methods based on a mapping unit. A representative address mapping method may include a page mapping method, a block mapping method, and a hybrid mapping method.

The processor 1010 may be configured to randomize data received from the host. For example, the processor 1010 may randomize the data received from the host by using a randomizing seed. The randomized data may be provided to the memory device as data to be stored and may be programmed to the memory cell array.

The processor 1010 may perform the randomization and the de-randomization by driving the software or the firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The error correction circuit 1030 may perform error correction. The error correction circuit 1030 may perform error correction encoding (ECC encoding) based on data to be written to the memory device through memory interface 1060. The error correction encoded data may be transferred to the memory device through the memory interface 1060. The error correction circuit 1030 may perform error correction decoding (ECC decoding) on the data that is received from the memory device through the memory interface 1060. For example, the error correction circuit 1030 may be included in the memory interface 1060 as a component of the memory interface 1060.

The host interface 1040 may be configured to communicate with an external host based on the processor 1010. The host interface 1040 may be configured to perform communication by using at least one of various communication methods, such as a universal serial bus (USB), a serial AT attachment (SATA), a serial attached SCSI (SAS), a high speed interchip (HSIC), a small computer system interface (SCSI), a peripheral component interconnection (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 may be configured to control the memory buffer 1020 based on control of the processor 1010.

The memory interface 1060 may be configured to communicate with the memory device based on control of the processor 1010. The memory interface 1060 may communicate a command, an address, and data with the memory device through a channel.

For example, the memory controller 1000 might not include the memory buffer 1020 and the buffer controller 1050.

For example, the processor 1010 may control the operation of the memory controller 1000 by using codes. The processor 1010 may load the codes from a non-volatile memory device (for example, a read only memory) that is provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other and might not interfere with each other or affect each other. The data bus may be connected to the host interface 1040, the buffer controller 1050, the error correction circuit 1030, and the memory interface 1060. The control bus may be connected to the host interface 1040, the processor 1010, the buffer controller 1050, the memory buffer 1020, and the memory interface 1060.

Figure 20:
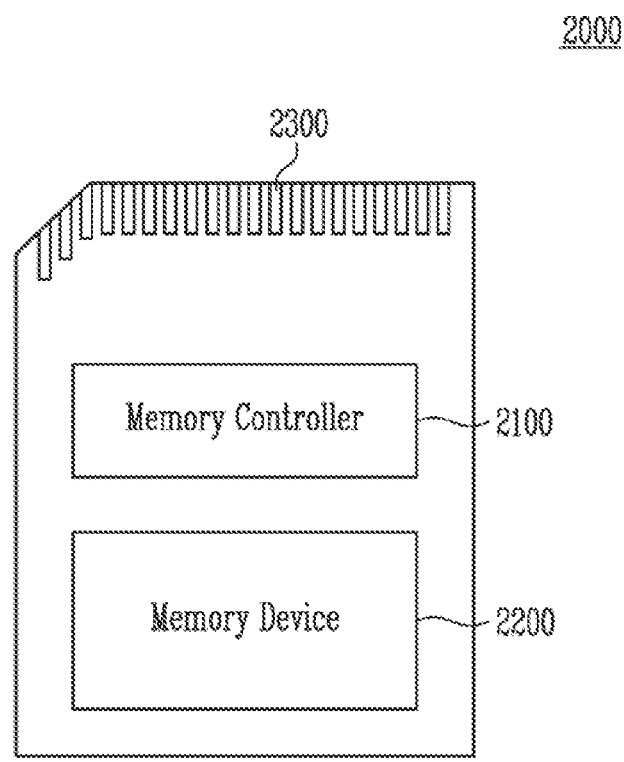
FIG. 20 is a block diagram, illustrating a memory card system to which the storage device, according to an embodiment of the present disclosure, is applied.

FIG. 20 is a block diagram, illustrating a memory card system to which the storage device, according to an embodiment of the present disclosure, is applied.

Referring to FIG. 20, the memory card system 2000 includes a memory controller 2100, a memory device 2200, and a connector 2300.

The memory controller 2100 may be connected to the memory device 2200. The memory controller 2100 may be configured to access the memory device 2200. For example, the memory controller 2100 may be configured to control read, write, erase, and background operations of the memory device 2200. The memory controller 2100 may be configured to provide an interface between the memory device 2200 and the host. The memory controller 2100 may be configured to drive the firmware to control the memory device 2200. The memory device 2200 may be implemented equally to the memory device 100 of FIG. 1 described with reference to FIG. 2.

As an example, the memory controller 2100 may include components, such as a random access memory (RAM), a processor, a host interface, a memory interface, and an error correction circuit.

The memory controller 2100 may communicate with an external device through the connector 2300. The memory controller 2100 may communicate with an external device (for example, the host) based on a specific communication standard. As an example, the memory controller 2100 may be configured to communicate with an external device through at least one of various communication standards, such as a universal serial bus (USB), a multi-media card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. As an example, the connector 2300 may be defined by at least one of the various communication standards described above.

As an example, the memory device 2200 may be implemented as various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 21:
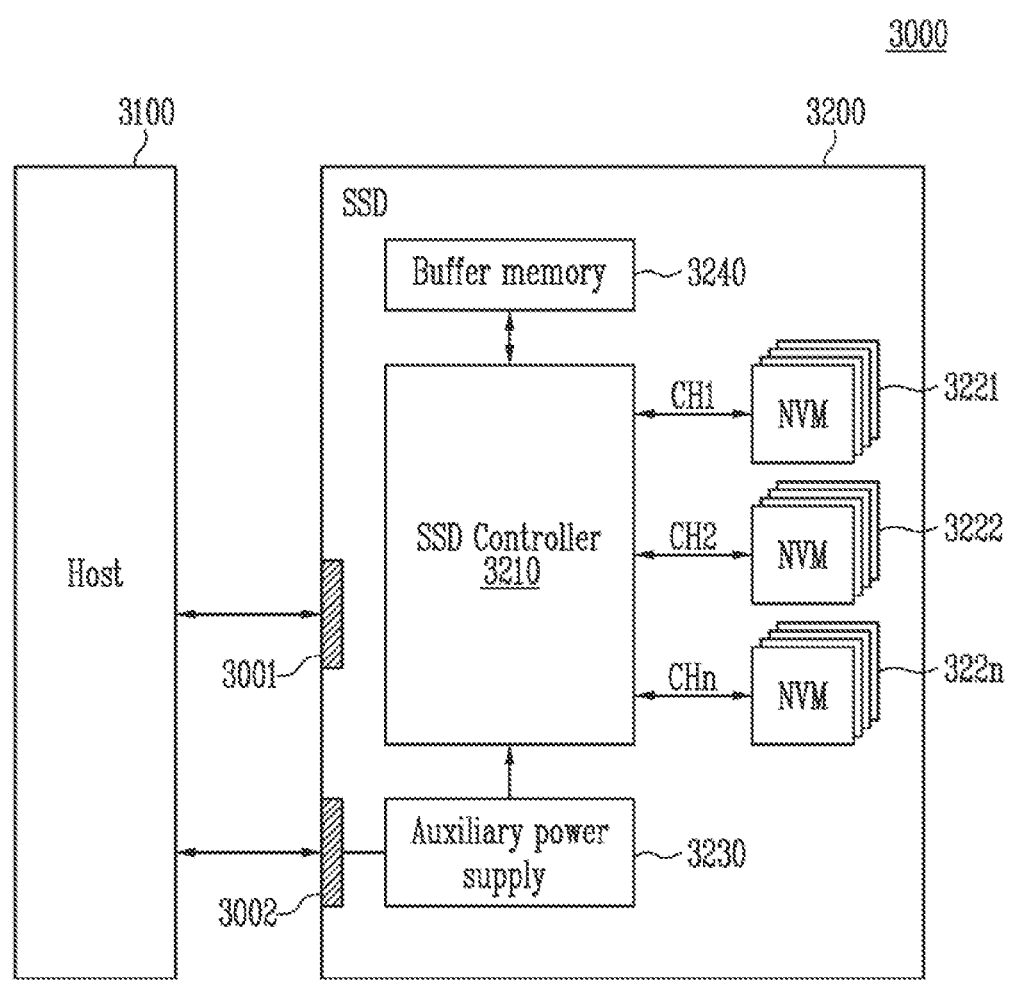
FIG. 21 is a block diagram, exemplary illustrating a solid state drive (SSD) system to which the storage device, according to an embodiment of the present disclosure, is applied.

FIG. 21 is a block diagram, exemplary illustrating a solid state drive (SSD) system to which the storage device, according to an embodiment of the present disclosure, is applied.

Referring to FIG. 21, the SSD system 3000 may include a host 3100 and an SSD 3200. The SSD 3200 may exchange a signal SIG with the host 3100 through a signal connector 3001 and may receive power PWR through a power connector 3002. The SSD 3200 may include an SSD controller 3210, a plurality of flash memories 3221 to 322n, an auxiliary power device 3230, and a buffer memory 3240.

In an embodiment, the SSD controller 3210 may perform a function of the memory controller 200 of FIG. 1, described with reference to FIG. 1.

The SSD controller 3210 may control the plurality of flash memories 3221 to 322n based on the signal SIG received from the host 3100. As an example, the signal SIG may be signals based on an interface between the host 3100 and the SSD 3200. For example, the signal SIG may be a signal that is defined by at least one of interfaces, such as a universal serial bus (USB), a multi-media card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 may be connected to the host 3100 through the power connector 3002. The auxiliary power device 3230 may receive the power PWR from the host 3100 and may charge the power. The auxiliary power device 3230 may provide power to the SSD 3200 when power supply from the host 3100 is not smooth. As an example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 may operate as a buffer memory of the SSD 3200. For example, the buffer memory 3240 may temporarily store data that is received from the host 3100 or data that is received from the plurality of flash memories 3221 to 322n or may temporarily store metadata (for example, a mapping table) of the flash memories 3221 to 322n. The buffer memory 3240 may include a volatile memory, such as a DRAM, an SDRAM, a DDR SDRAM, an LPDDR SDRAM, and a GRAM, or a non-volatile memory such as an FRAM, a ReRAM, an STT-MRAM, and a PRAM.

Figure 22:
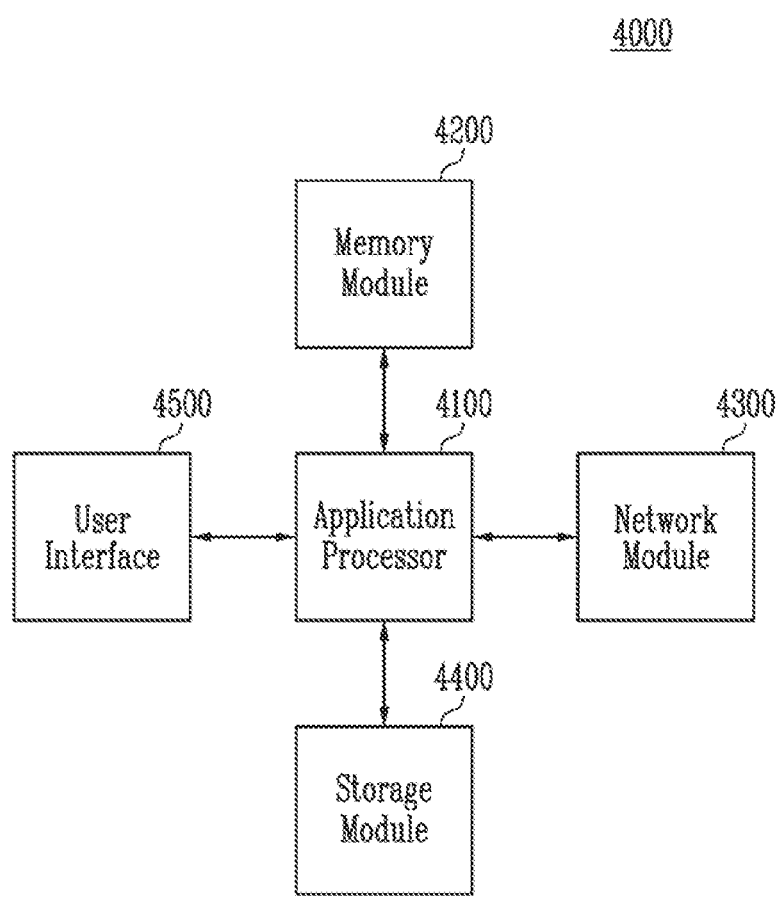
FIG. 22 is a block diagram, illustrating a user system to which the storage device, according to an embodiment of the present disclosure, is applied.

FIG. 22 is a block diagram, illustrating a user system to which the storage device, according to an embodiment of the present disclosure, is applied.

Referring to FIG. 22, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory, such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication, such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. For example, the network module 4300 may be included in the application processor 4100.

The storage module 4400 may store data. For example, the storage module 4400 may store data received from the application processor 4100. Alternatively, the storage module 4400 may transmit data that is stored in the storage module 4400 to the application processor 4100. For example, the storage module 4400 may be implemented as a non-volatile semiconductor memory element, such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of non-volatile memory devices, and the plurality of non-volatile memory devices may operate identically to the memory device that is described with reference to FIGS.

2 and 3. The storage module 4400 may operate identically to the storage device 50 that is described with reference to FIG. 1.

The user interface 4500 may include interfaces that input data or instruction to the application processor 4100 or that output data to an external device. For example, the user interface 4500 may include user input interfaces, such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces, such as a liquid crystal display (LCD), an organic light emitting diode (OLED) display device, an active matrix OLED (AMOLED) display device, an LED, a speaker, and a monitor.

What is claimed is:

1. A storage device comprising:
    a plurality of memory devices comprising a target memory device in which an operation is performed and non-target memory devices; and
    a memory controller configured to control the plurality of memory devices,
    wherein the target memory device generates and outputs a flag that indicates that an on die termination (ODT) operation is possible for the non-target memory devices,
    wherein the non-target memory devices receive the flag generated from the target memory device and perform the ODT operation based on the flag, and
    wherein each of the plurality of memory devices comprises:
        an ODT flag generator configured to generate the flag; and
        an ODT performer configured to determine whether the ODT operation is an ODT read operation for a read operation or an ODT write operation for a write operation based on the flag and configured to generate an enable signal that enables the ODT read operation or the ODT write operation.

2. The storage device of claim 1, wherein the flag distinguishes between the target memory device and the non-target memory devices.

3. The storage device of claim 1, wherein, when the target memory device performs the read operation, the ODT flag generator of the target memory device generates the flag based on a signal that enables the read operation.

4. The storage device of claim 1, wherein, when the target memory device performs the write operation, the ODT flag generator of the target memory device generates the flag based on an input/output strobe signal, indicating that data is valid, when the data that corresponds to the write operation is input.

5. The storage device of claim 1, wherein the memory controller distinguishes between the target memory device and the non-target memory devices based on the flag and outputs a parameter setting command to perform the ODT operation on the non-target memory devices.

6. The storage device of claim 5, wherein the non-target memory devices perform only operations related to performing the ODT operation based on the parameter setting command.

7. The storage device of claim 1, wherein the ODT operation on the non-target memory devices is performed on each of the non-target memory devices.

8. The storage device of claim 1, wherein the ODT performer that is included in each of the non-target memory devices receives the flag and then outputs a signal to enable a buffer that is included in the memory controller for the ODT operation.

9. The storage device of claim 1, wherein, when the ODT operation is the ODT read operation, the ODT performer that is included in each of the non-target memory devices outputs an ODT read enable signal that provides instructions to perform impedance matching for the read operation.

10. The storage device of claim 1, wherein, when the ODT operation is the ODT write operation, the ODT performer that is included in each of the non-target memory devices outputs an ODT write enable signal that provides instructions to perform impedance matching for the write operation.

11. A method of operating a storage device with a plurality of memory devices and a memory controller that controls the plurality of memory devices, the method comprising:
    performing an operation, by a target memory device, among the plurality of memory devices;
    generating, by the target memory device, a flag indicating that an on die termination (ODT) operation is possible for non-target memory devices excluding the target memory device among the plurality of memory devices;
    receiving the flag, by the non-target memory devices;
    determining whether the ODT operation is an ODT read operation for a read operation or an ODT write operation for a write operation based on the flag; and
    generating, by the non-target memory devices, an enable signal that enables the ODT read operation or the ODT write operation.

12. The method of claim 11, wherein the flag distinguishes between the target memory device and the non-target memory devices.

13. The method of claim 11, wherein, when the target memory device performs the read operation, the flag is generated based on a signal that enables the read operation.

14. The method of claim 11, wherein, when the target memory device performs the write operation, the flag is generated based on a signal that enables the write operation.

15. The method of claim 11, further comprising:
    distinguishing between the target memory device and the non-target memory devices based on the flag; and
    outputting, by the memory controller, a parameter setting command so that the ODT operation is performed on the non-target memory devices.

16. The method of claim 15, wherein the non-target memory devices perform only operations related to performing the ODT operation based on the parameter setting command.

17. The method of claim 11, wherein the ODT operation on the non-target memory devices is performed on each of the non-target memory devices.

18. The method of claim 11, further comprising:
    outputting, by the non-target memory devices, a signal for the ODT operation, after receiving the flag, enabling a buffer that is included in the memory controller.

19. The method of claim 11, wherein, in generating the enable signal, when the ODT operation is the ODT read operation, the non-target memory devices output an ODT read enable signal that provides instructions to perform impedance matching for the read operation.

20. The method of claim 11, wherein, in generating the enable signal, when the ODT operation is the ODT write operation, the non-target memory devices output an ODT write enable signal that provides instructions to perform impedance matching for the write operation.

* * * * *